(12) United States Patent
Friedman et al.

(10) Patent No.: US 7,818,149 B2
(45) Date of Patent: Oct. 19, 2010

(54) TRANSIENT RESPONSE OF A DISTRIBUTED RLC INTERCONNECT BASED ON DIRECT POLE EXTRACTION

(75) Inventors: Eby G. Friedman, Rochester, NY (US); Guoqing Chen, Folsom, CA (US)

(73) Assignee: University of Rochester, Rochester, NY (US)

( * ) Notice: Subject to any disclaimer, the term of this patent is extended or adjusted under 35 U.S.C. 154(b) by 549 days.

(21) Appl. No.: 11/856,932

(22) Filed: Sep. 18, 2007

(65) Prior Publication Data
US 2008/0071506 A1    Mar. 20, 2008

Related U.S. Application Data

(60) Provisional application No. 60/845,250, filed on Sep. 18, 2006.

(51) Int. Cl.
*G06F 17/10* (2006.01)
(52) U.S. Cl. .......................................................... 703/2
(58) Field of Classification Search ...................... 703/2
See application file for complete search history.

(56) References Cited

OTHER PUBLICATIONS

J. Paul et al., "Time-domain simulation of thin material boundaries and thin panels using digital filters in TLM", 2002, Turk J Elec Engin, vol. 10, No. 2, pp. 185-198.*

Yehea I. Ismail et al., "DTT: Direct Truncation of the Transfer Function—An Alternative to Moment Matching for Tree Structured Interconnect", 2002, IEEE Transactions on Computer-Aided Design of Integrated Circuits and Systems, vol. 21, No. 2, p. 131-144.*

Yuichi Tanji et al., "Closed-form expressions of distributed RLC interconnects for analysis of on-chip inductance effects", 2004, DAC 2004, pp. 810-813.*

Gabor C. Temes, "Analog MOS Integrated Circuits", 1988, University of California Los Angeles, pp. 1-18.*

Sakurai, "Approximation of Wiring Delay in MOSFET LSI," IEEE Journal of Solid-State Circuits, vol. SC-18, No. 4, pp. 418-426, Aug. 1983.

Sakurai, "Closed-Form Expressions for Interconnection Delay, Coupling, and Crosstalk in VLSI's," IEEE Transactions on Electron Devices, vol. 40, No. 1, pp. 118-124, Jan. 1993.

Khang, Muddu, "An Analytical Delay Model for RLC Interconnects," IEEE Transactions on Computer-Aided Design of Integrated Circuits and Systems, vol. 16, No. 12, pp. 1507-1514, Dec. 1997.

(Continued)

*Primary Examiner*—Paul L Rodriguez
*Assistant Examiner*—Russ Guill
(74) *Attorney, Agent, or Firm*—William Greener; Bond, Schoeneck & King, PLLC

(57) ABSTRACT

A computer system for simulating performance of transmission lines, such as on-chip interconnects. The simulation uses direct extraction of poles, in contrast to conventional methods using poles obtained by a truncated transfer function. Using the directly extracted poles, far end response characteristic(s) can be determined to thereby aid in design of circuits using transmission lines. The far end response characteristic(s) that may be determined based on the directly extracted poles include, but are not necessarily limited to, frequency dependent effects, step response, ramp response, delay, 50% delay, rise time, 10% to 90% rise time, overshoot and normalized overshoot. A CAE tool designer and/or CAE tool user may decide how many pole pairs to directly extract to achieve a desired balance between computation resources required and resulting precision in the determination of far end response characteristic(s).

8 Claims, 14 Drawing Sheets

OTHER PUBLICATIONS

Banjeree, Mehrotra, "Accurate Analysis of On-Chip Inductance Effects and Implications for Optimal Repeater Insertion and Technology Scaling," 2001 Symposium on VLSI Circuits Digest of Technical Papers. pp. 195-198, 2001.

Davis, Meindl, "Compact Distributed RLC Interconnect Models—Part I: Single Line Transient, Time Delay, and Overshoot Expressions," IEEE Transactions on Electron Devices, vol. 47, No. 11, pp. 2068-2077, Nov. 2000.

Eo, Shim, Eisenstadt, "A Traveling-Wave Based Waveform Approximation Technique for the Timing Verification of Single Transmission Lines," IEEE Transactions on Computer-Aided Design of Integrated Circuits and Systems. vol. 21. No. 6, pp. 723-730, Jun. 2002.

Chen, He, "Piecewise Linear Model for Transmission Line with Capacitive Lading and Ramp Input," IEEE Transactions on Computer-Aided Design of Integrated Circuits and Systems, vol. 24, No. 6, pp. 926-937, Jun. 2005.

Chen, Friedman, "An RLC Interconnect Model Based on Fourier Analysis," IEEE Transactions on Computer-Aided Design of Integrated Circuits and Systems, vol. 24. No. 2, pp, 170-183, Feb. 2005.

Dally, Towles, "Route Packets, Not Wires: On-Chip Interconnection Networks," DAC 2001, pp. 684-689, Jun. 2001.

Cao, et al., "Effective On-Chip Inductance Modeling for Multiple Signal Lines and Application to Repeater Insertion." IEEE Transactions on Very Large Scale Integration (VLSI) Systems, vol. 10, No. 6, pp. 799-805, Dec. 2002.

Pillage, Huang, Rohrer, "AWEsim: Asymptotic Waveform Evaluation for Timing Analysis," 26th ACM/IEEE Design Automation Conference, pp. 634-637, 1989.

Kamon, Tsuk, White, "FastHenry: A Multipole-Accelerated 3-D Inductance Extraction Program," 30th ACM/IEEE Design Automation Conference, pp. 678-683, 1993.

Nabors, White. "FastCap: A Multipole Accelerated 3-D Capacitance Extraction Program." IEEE Transactions on Computer-Aided Design, vol. 10, No. 11. pp. 1447-1459, Nov. 1991.

Qian, Pullela, Pillage, "Modeling the "Effective Capacitance" for the RC Interconnect on CMOS Gates," IEEE Transactions on Computer-Aided Design of Integrated Circuits and Systems, vol. 13. No. 12, pp. 1526-1535, Dec. 1994.

Agarwal, Sylvester, Blaauw, "An Effective Capacitance Based Driver Output Model for On-Chip RLC Interconnects," DAC 2003. pp. 376-381, 2003.

Vakati, Wang, "A New Multi-Ramp Driver,Model with RLC Interconnect Load," IEEE ISCAS 2004, pp. 269-272, 2004.

Open Source ECSM Format Specification Version 1.2, Liberty Extensions for ECSM. pp. 1-21, Copyright 2004.

Composite Current Source, published at: http://www.synopsis.com/products/solutions/galaxy/ccs/cc.source.html, as of Sep. 1, 2006.

Croix, Wong, "Blade and Razor: Cell and Interconnect Delay Analysis Using Current-Based Models." DAC 2003. pp. 386-389, 2003.

Ismail, Friedman, "Effects of Inductance on the Propagation Delay and Repeater Insertion in VLSI Circuits," DAC 99, 1999.

Dartu, Menezes, Pileggi, "Performance Computation for Precharacterized CMOS Gates with RC Loads," IEEE Transactions on Computer-Aided Design of Integrated Circuits and Systems, vol. 15, No. 5, pp. 544-553, May 1996.

Ismail. Friedman, Neves. "Figures of Merit to Characterize the Importance of On-Chip Inductance," DAC 98, 1998.

Krauter, Mehrotra, "Layout Based Frequency Dependent Inductance and Resistance Extraction for On-Chip Interconnect Timing Analysis." DAC 98, pp. 303-308, Jun. 1998.

Sim. Lee, Yang, "High-Frequency On-Chip Inductance Model," IEEE Electron Device Letters. vol. 23, No. 12, pp. 740-742, Dec. 2002.

Cao, et al., "Impact of On-Chip Interconnect Frequency-Dependent R(f)L(f) on Digital and RF Design" Jan. 2005.

* cited by examiner

Input: $R, L, C, R_d, C_L$
Output: $m$ pairs of low-order poles
Find_poles($R, L, C, R_d, C_L$)
{
   Calculate $R'$ and $C'_L$
   Calculate $m$ pairs of approximated poles $p_{n,\pm}$ over_damped=0
   for $n = 0 : m - 1$
   {
      $p_{n,\pm}$=Newton_Raphson($p_{n,\pm}$)
      if $p_{n,+}$ is real
         if over_damped==1
            Discard poles $p_{n,\pm}$
         else
            over_damped=1
            if $F'(p_{n,+}) < F_{th}$
               $p_{n,-}$=Newton_Raphson($2p_{n,+}$)
               if $p_{n,-} == p_{n,+}$
            output message: double-pole case
            return
               end
            else
               $p_{n,-}$=Newton_Raphson($5p_{n,+}$)
               if $p_{n,-} == p_{n,+}$ or $p_{n,-}$ does not converge
            Discard $p_{n,-}$
               end
            end
         end
      end
} return $p_{n,\pm}, n = 0 : m - 1$
}

Fig. 13

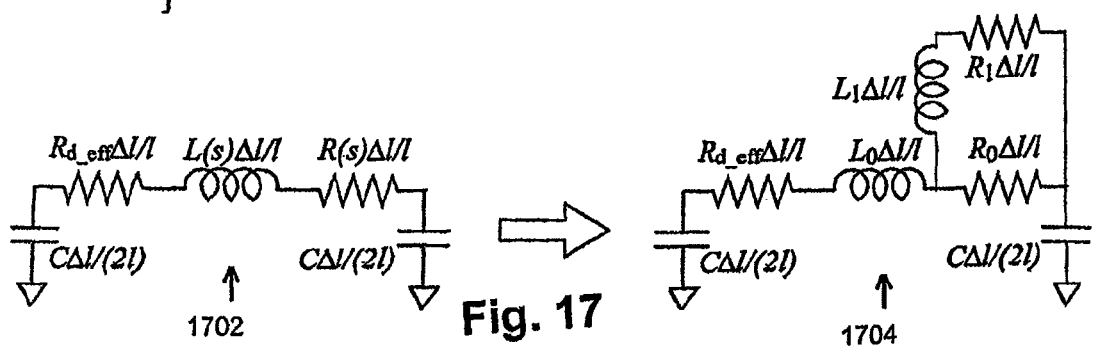

Fig. 17

TRANSIENT RESPONSE OF A DISTRIBUTED RLC INTERCONNECT BASED ON DIRECT POLE EXTRACTION

RELATED APPLICATION

The present application claims priority to U.S. Provisional Application No. 60/845,250, filed on Sep. 18, 2006; all of the foregoing patent-related document(s) are hereby incorporated by reference herein in their respective entirety(ies).

FEDERALLY SPONSORED RESEARCH OR DEVELOPMENT

The U.S. Government may have certain rights in this invention pursuant to Grant No. C040130 awarded by NYSTAR and Grant No. CCF0541206 awarded by National Science Foundation.

BACKGROUND OF THE INVENTION

1. Field of the Invention

The present invention relates to computer systems for simulating (see definitions sections) the performance of electronic circuits and more particularly to computer software for simulating on-chip interconnects and/or other conductors that behave as transmission lines.

2. Description of the Related Art

Certain electrical conductors behave as transmission lines. When conducting electrical signals, these conductors exhibit far end response characteristics (see Definitions section), such as frequency dependent effects, step response, ramp response, delay, 50% delay, rise time, 10% to 90% rise time, overshoot and normalized overshoot. Designers of systems using transmission lines often must take various far end response characteristics into account in the circuit design. For example, on-chip interconnects exhibit significant transmission line behavior, especially with the scaling of CMOS technology and its associated high performance integrated circuits (ICs), which use relatively high frequencies and relatively long wire lengths.

For CMOS IC on-chip interconnect design, on-chip interconnect design more generally, and even other types of transmission line design, the circuits are simulated on computer systems, as they are designed. The computer system (generally in its software component) allows the designer to simulate transmission lines and to determine or estimate the far end characteristics. In this way, the timing characteristics sent over the transmission lines can be determined, preferably with sufficient accuracy and precision so that the design (for example, CMOS IC chip design) will work for its intended purpose at its operating frequency(ies).

In order for the computer system to simulate the transmission line and determine or estimate the desired far end response characteristics, the line is mathematically modeled as an RC interconnect or, more commonly, as an RLC interconnect (see Definitions section). For example, many computer aided engineering (CAE) simulation tools conventionally include RLC interconnect simulation for use in simulating the performance of on-chip interconnects. Some conventional methods for determining (see Definitions section) far end response characteristics of RLC interconnects will now be described.

Krylov-subspace-based methods, such as Arnoldi algorithm, are commonly used in simulations of interconnect structures with lumped RLC components. For a single wire structure (that is, point-to-point connection) a large number of RLC lumped components are required to simulate the distributed RLC performance of a distributed RLC interconnect. This is relatively inefficient.

Spectre simulations are used in RLC interconnect simulation and can provide accurate results. However, Spectre simulations consume much more simulation time and are inefficient.

Another conventional method is disclosed in the following articles: (i) T. Sakurai, "Approximation of Wiring Delay in MOSFET LSI," IEEE Journal of Solid-State Circuits, Vol. 18, No. 4, pp. 418-426, August 1983; and (ii) T. Sakurai, "Closed-Form Expressions for Interconnection Delay, Coupling, and Crosstalk in VLSI's," IEEE Transactions on Electron Devices, Vol. 40, No. 1, pp. 118-124, January 1993. (collectively "Sakurai"). In Sakurai, an accurate closed-form solution is disclosed for distributed RC interconnect based on a single pole approximation.

By truncating the transfer function, multi-pole models have been proposed in the last decade to capture the effect of inductance. One example of this method, using two poles is disclosed in A. B. Kahng and S. Muddu, "An Analytical Delay Model for RLC Interconnects," IEEE Transactions on Computer-Aided Design of Integrated Circuits and Systems, Vol. 16, No. 12, pp. 1507-1514, December 1997 ("Kahng"). At page 1509, Kahng sets forth the exact transfer function for an RLC interconnect, but then truncates it by expanding the hyperbolic functions present in the transfer function as infinite series, and then collecting terms in this series up to the coefficient of $s^2$. Use this truncated version of the transfer function means that the poles obtained by Kahng are approximate and not exact. Kahng goes on to derive a delay model from the two pole response for the real pole case, the complex pole case and the double pole case.

Another example of this method of truncating the transfer function, using four poles, is disclosed in K. Banerjee and A. Mehrotra, "Accurate Analysis of On-Chip Inductance Effects and Implications for Optimal Repeater Insertion and Technology Scaling," Proceedings of the IEEE Symposium on VLSI Circuits, pp. 195-198, June 2001 ("Banerjee"). No closed-form solution, however, is provided for the four-pole method. Like Kahng, Banerjee also sets forth the exact transfer function for an RLC interconnect (see Banerjee at equation (1)), including the hyperbolic terms in the denominator. Banerjee then proceeds to truncate this equation by substituting a fourth-order Padé approximation of the transfer function. The fourth-order approximation has terms up to the order of $s^4$, instead of merely up to the order of $s^2$, as in Kahng. Still, the transfer function itself is truncated. Banerjee proceeds to use this truncated version of transfer function to calculate step-response for appropriate residues and approximate poles.

In J. A. Davis and J. D. Meindl, "Compact Distributed RLC Interconnect Models—Part I: Single Line Transient, Time Delay, and Overshoot Expressions," IEEE Transactions on Electron Devices, Vol. 47, No. 11, pp. 2068-2077, November 2000 ("Davis"), the solution for an open-ended interconnect with a step input signal is rigorously developed. This solution however is highly complicated and not suitable for an exploratory design process.

In Y. Eo, J. Shim, and W. R. Eisenstadt, "A Traveling-Wave-Based Waveform Approximation Technique for the Timing Verification of Single Transmission Lines," IEEE Transactions on Computer-Aided Design of Integrated Circuits and Systems, Vol. 21, No. 6, pp. 723-730, June 2002 ("Eo"), a traveling wave analysis (TWA) model has been presented, where the key points of the waveform are determined with a three-pole model and linear or RC approximations are used to connect those key points to construct the waveform. This method is improved in J. Chen and L. He, "Piecewise Linear Model for Transmission Line With Capacitive Loading and Ramp Input," IEEE Transactions on Computer-Aided Design of Integrated Circuits and Systems, Vol. 24, No. 6, pp. 928-937, June 2005 ("J. Chen"). In J. Chen, the key points and slopes are more accurately determined with the model described in Davis, and straight lines are used to construct the signal waveforms in different time regions. In both Eo and J. Chen, the output response is divided into a number of time regions where the waveform expressions for each of the regions are different, making the models less compact. Furthermore, none of these aforementioned papers consider frequency dependent effects.

With higher on-chip frequencies, frequency dependent effects in wider interconnect can no longer be ignored. One article dealing with frequency dependent effect was written by the named inventors for this document: G. Chen and E. G. Friedman, "An RLC Interconnect Model Based on Fourier Analysis," IEEE Transactions on Computer-Aided Design of Integrated Circuits and Systems, Vol. 24, No. 2, pp. 170-183, February 2005 ("G. Chen Article"). In the G. Chen Article, a Fourier analysis based interconnect model is proposed, where the far end response is approximated by the first several harmonics. Frequency dependent effects can be included in this model; however, the model of the G. Chen Article is only suitable for periodic signals.

Description Of the Related Art Section Disclaimer: To the extent that specific publications are discussed above in this Description of the Related Art Section, these discussions should not be taken as an admission that the discussed publications (for example, published patents) are prior art for patent law purposes. For example, some or all of the discussed publications may not be sufficiently early in time, may not reflect subject matter developed early enough in time and/or may not be sufficiently enabling so as to amount to prior art for patent law purposes. To the extent that specific publications are discussed above in this Description of the Related Art Section, they are all hereby incorporated by reference into this document in their respective entirety(ies).

BRIEF SUMMARY OF THE INVENTION

The present invention is directed to a computer system that mathematically models the performance of a transmission line based on direct pole extraction of an exact transmission line transfer function rather than obtaining the poles of a truncated transfer function as is conventional. Preferably, closed form expressions of the poles are developed for the zero driver resistance case. To utilize these expressions in the case of a transmission line with driver resistance, the interconnect transmission with driver resistance can be converted to a system without a driver resistance. Based on these directly extracted poles, one or more far end response characteristic(s) may additionally be determined. For example, closed form expressions for the step and ramp responses are preferably determined.

With two pairs of poles, some embodiments of the present invention may provide an accurate delay estimate, exhibiting an average error of 1% as compared to Spectre simulations. Higher accuracy can be obtained with additional poles. A trade-off between accuracy and efficiency is provided by the simulation of the computer systems according to the present invention. Specifically, the computational complexity of the model is proportional to the number of pole-pairs that are included in the simulation.

Various embodiments of the present invention may exhibit one or more of the following objects, features and/or advantages:

(1) more efficient than Krylov-subspace-based methods and/or Spectre simulations in simulations of single interconnects;

(2) flexibility in simulation by choice of number of pole pairs, depending on factors such as computational resources available and required accuracy and/or precision;

(3) useful in CAE tools;

(4) allows timing of transmission line signals to be determined and controlled with relative accuracy and precision;

(5) can account for effects of interconnect inductance;

(6) average error in delay, rise-time and/or over-shoots can be made relatively small compared to other non-Spectre simulation type methods;

(7) allows simulation of frequency dependent effects, and excellent match has observed between simulation according to the present invention and corresponding Spectre simulation;

(8) distributed characteristic of the RLC interconnect is considered implicitly;

(9) in some applications, dummy fillings are inserted on-chip to achieve a uniform pattern density, making a uniform impedance assumption, as used in the present invention, a more accurate simulation;

(10) can be used as the basis of an EDA software tool;

(11) good performance for on-chip interconnect simulation at relatively high on-chip signal frequencies; and

(12) useful for simulations in the context of CMOS technology.

One aspect of the present invention is directed to a computer system including a first computer portion and a second computer portion. The first computer portion is structured and/or programmed to receive input characteristics of a transmission line to be simulated as an RLC distributed interconnect, with the input characteristics being sufficient to define a transfer function for the simulated RLC interconnect. The second computer portion is structured and/or programmed to determine at least one pole of the transfer function such that the transfer function is not truncated in the determination of the at least one pole.

A further aspect of the present invention is directed to a computer system including a first computer portion, a second computer portion and a third computer portion. The first computer portion is structured and/or programmed to receive input characteristics of a transmission line to be simulated as an RLC distributed interconnect, with the input characteristics being sufficient to define a transfer function for the simulated RLC interconnect. The second computer portion structured and/or programmed to approximate at least one pole of the transfer function. The third computer portion structured and/or programmed to determine at least one exact pole of the transfer function by applying Newton-Raphson method to the at least one pole as determined by the second computer portion.

A further aspect of the present invention is directed to a computer system including a first computer portion and a second computer portion. The first computer portion is structured and/or programmed to receive input characteristics of a transmission line to be simulated as an RLC distributed interconnect, with the input characteristics being sufficient to define a transfer function for the simulated RLC interconnect. The second computer portion is structured and/or programmed to determine at least one pole of the transfer function by transforming the denominator of the transfer function into terms of a variable x, finding at least one value for x such that the transformed denominator is equal to zero and using the at least one value for x to determine the at least one pole of the transfer function.

BRIEF DESCRIPTION OF THE DRAWINGS

The present invention will be more fully understood and appreciated by reading the following Detailed Description in conjunction with the accompanying drawings, in which:

FIG. 13 is a graph comparing waveforms obtained using methods of the present invention to corresponding waveforms obtained by corresponding Spectre simulation;

FIG. 17 is a schematic of two stage ladder structure of frequency independent elements;

DETAILED DESCRIPTION OF THE INVENTION

Figure 1:
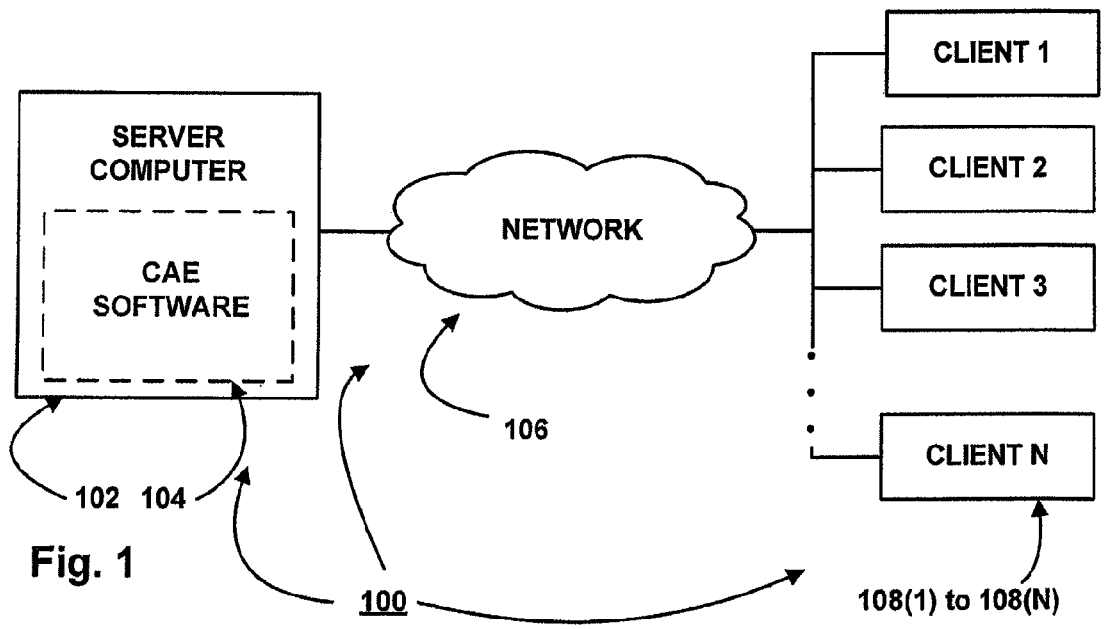
FIG. 1 is a schematic of a first embodiment of a computer system according to the present invention.
Figure 2:
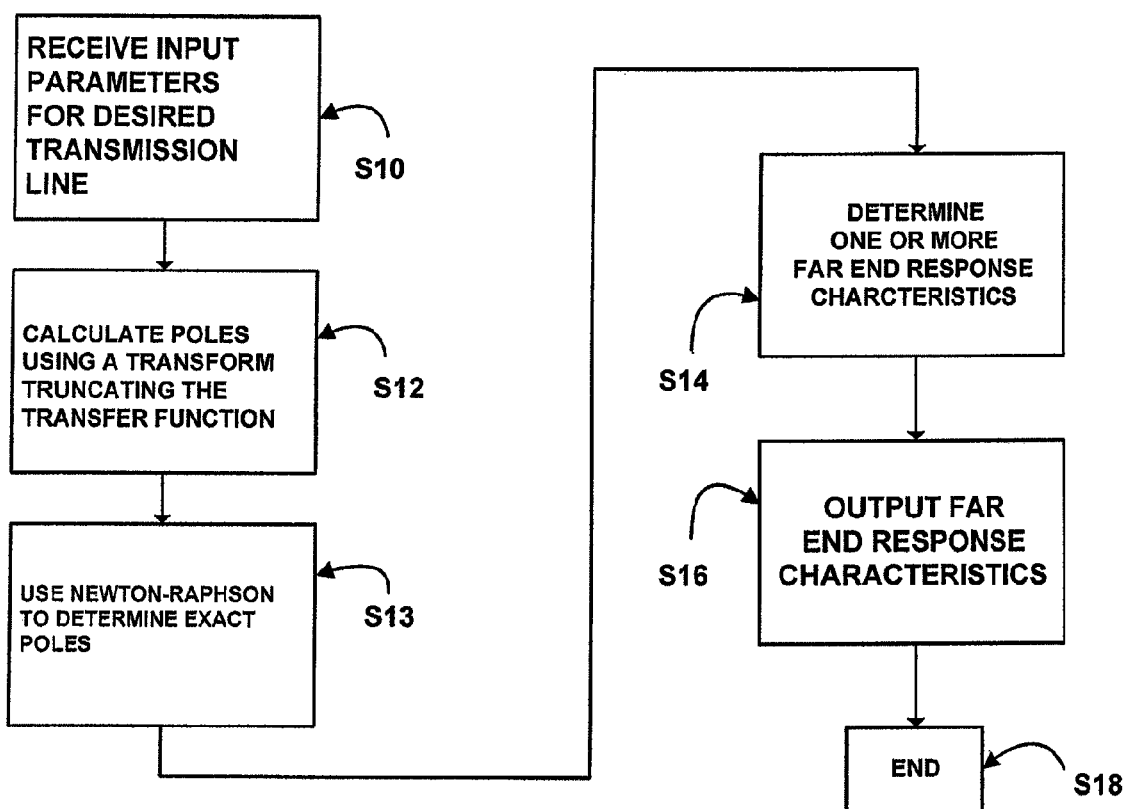
FIG. 2 is a flowchart of a first embodiment of a method according to the present invention.

FIG. 1 shows a computer system 100 according to the present invention including server computer 102; network 106 and client computers 108(1) to 108(N). Server computer 102 includes CAE software 104 according to the present invention where the CAE software operates according to the methods for determining poles and/or far end characteristics of a simulated transmission line, such as an on-chip interconnect. FIG. 2 is a flowchart, including steps S10, S12, S13, S14, S16 and S18, describing the operation of software 104 in general terms. Network 106 may be any type of computer network now known or to be developed in the future, including wired networks, wireless networks and networks including both wired and wireless portions. Preferably, access to software 104 is password protected so that "seats" may be sold and the costs of developing and maintaining the software may be recovered by the software provider(s).

Alternatively, the computer systems of the present invention may perform the inventive methods and/or algorithms of the present invention in whole, or in part, by firmware and/or hardware. Although FIG. 1 shows a standard networked arrangement for distribution of the software and associated computation, other arrangements could be used, such as a stand-alone mainframe computer, a stand-alone personal computer, a server computer with dummy terminals, or any other computer architecture now known or to be developed in the future.

The simulation model, to be used in conjunction with the system of FIG. 1 and the method of FIG. 2 is based on a direct pole extraction of the exact transfer function of a transmission line, rather than by approximating the poles by truncating the transfer function, or matching moments. Closed-form waveform expressions will be discussed, permitting flexible tradeoffs between accuracy and efficiency.

Figure 3:
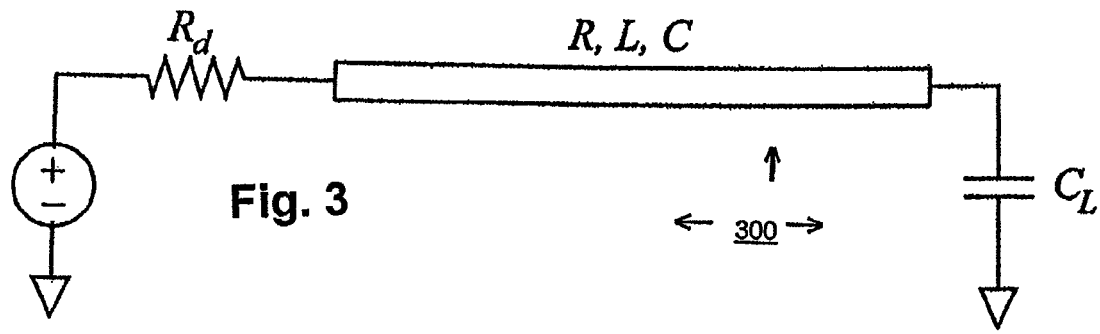
FIG. 3 is a schematic of a transmission line type conductor that has been simulated as an RLC interconnect.

Now, the exact poles of two special case interconnect systems will be determined. Based on these exact poles, the corresponding step and ramp responses will be developed. For a distributed RLC interconnect driven by a voltage source with a driver resistance $R_d$ and loaded with a lumped capacitance $C_L$, as shown in FIG. 3 at simulation schematic 300, the transfer function is given by the following equation (1):

$$H(s) = \frac{1}{(1 + R_d C_L s)\cosh(\theta) + (R_d/Z_c + Z_c C_L s)\sinh(\theta)},$$

where $\theta = \sqrt{(R+Ls)Cs}$ and $Zc = \sqrt{(R+Ls)/Cs} = \theta/Cs$. R, L and C are respectively the resistance, inductance and capacitance of the simulated interconnect. The poles of equation (1) are difficult to solve directly, except for two special cases: (i) an RC interconnect; and (ii) an RLC interconnect with a zero driver resistance. Below, the poles of an RC interconnect system will be solved. Following the RC interconnect solution, the poles of an RLC interconnect with a zero driver resistance will be solved. Following the RLC solution, step and ramp responses will be developed.

For the RC interconnect, L=0. The transfer function, given in equation (1), can be rewritten as the following equation (2):

$$H(s) = \frac{1}{(1 + A\theta^2)\cosh(\theta) + B\theta\sinh(\theta)}, \quad (2)$$

where $A = R_T C_T,$ $B = R_T + C_T,$ $R_T = R_d/R,$ $C_T = C_L/C,$ and $\theta = \sqrt{RCs}.$ Let $F(s)=1/H(s)$. The poles of H(s) are zeros of F(s) and satisfy F(s)=0. Observe that $\theta$ needs to be an imaginary number to make F(s) zero. Assume $\theta=jx$, where x is a real number. Expression F(s)=0 can be transformed to the following equations (3) or (4):

$$(1 - Ax^2)\cos x - Bx\sin x = 0, \qquad (3)$$

or $$\tan x = \frac{1 - Ax^2}{Bx}. \qquad (4)$$

Figure 4:
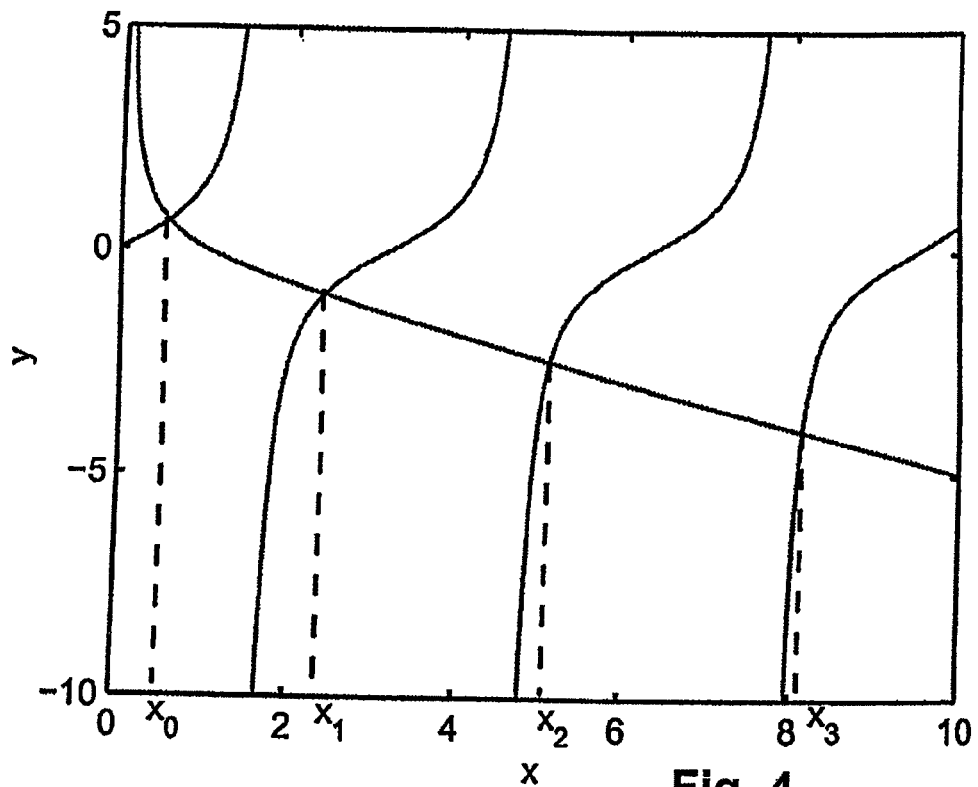
FIG. 4 is a graph showing the roots of equation (4)

The roots of equation (4) are the crossing points of the functions of y=tan x and y=(1−Ax²)/(Bx), as shown in the graph of FIG. 4. FIG. 4 is a graph of the roots of equation (4), where $R_T=C_T=1$.

Applying Taylor series expansions of cos x≈1−x²/2+x⁴/24 and sin x≈x−x³/6 to equation (3), and ignoring those terms with an order higher than x⁴ results in the following equation (5):

$$\left(\frac{1}{2}A + \frac{1}{6}B + \frac{1}{24}\right)x^4 - \left(\frac{1}{2} + A + B\right)x^2 + 1 = 0. \qquad (5)$$

Although equation (5) applies a Taylor series expansion where higher order terms are ignored, this is not considered to be a truncation or an approximation of the transfer function because equations (3) and (4) do not represent the transfer function or a portion thereof. Solving (5) for the smaller $x^2$ yields the following equation (6):

$$x_0^2 = \frac{\frac{1}{2} + A + B - \sqrt{(A+B)^2 - A + \frac{1}{3}B + \frac{1}{12}}}{A + \frac{1}{3}B + \frac{1}{12}}. \qquad (6)$$

When $R_T = C_T = 0$, the exact value of $x_0^2$ is $\pi^2/4$.

In order to capture this trend, equation (6) is revised to the following equation (7):

$$x_0^2 = \frac{\frac{1}{2} + A + B - \sqrt{(A+B)^2 - A + \frac{1}{3}B + \frac{1}{11.54}}}{A + \frac{1}{3}B + \frac{1}{12}}. \qquad (7)$$

Note that if the term x⁴ in equation (5) is ignored, the solution simplifies the following equation (8):

$$x_0^2 = \frac{1}{0.5 + A + B} = \frac{1}{0.5 + R_T + C_T + R_T C_T}, \qquad (8)$$

which is similar to the solution provided in Sakurai. Since the Taylor series approximations used in equation (5) are expanded around zero, the solution shown in equation (7) corresponds to the root $x_0$ which is closest root to zero, as show in FIG. 4. In order to obtain other high order solutions, Taylor series approximations expanded at nπ(n=1, 2, . . . ) are used. Since the negative roots of equation (3) have the same absolute value as the positive roots, only positive roots are considered in this analysis. Let Δx=x−nπ, cos x≈(−1)ⁿ[1−(Δx)²/2], and sin x≈(−1)ⁿΔx. Substituting these Taylor series approximations into equation (3) and ignoring those terms with an order higher than (Δx)² results in the following equation 9:

$$\left(A + B - \frac{1}{2}E\right)(\Delta x)^2 + (2A + B)n\pi\Delta x + E = 0,$$

where $E = An^2\pi^2 - 1$.

Although equation (9) applies a Taylor series expansion where higher order terms are ignored, this is not considered to be a truncation or an approximation of the transfer function because equation (3) does not represent the transfer function or a portion thereof. Solving equation (9) for $x_n$ results in the following equation (10):

$$x_n = \frac{-(2A+B)n\pi + \sqrt{(n\pi B)^2 + 4(A+B) + 2E^2}}{2(A+B) - E}$$

Figure 5:
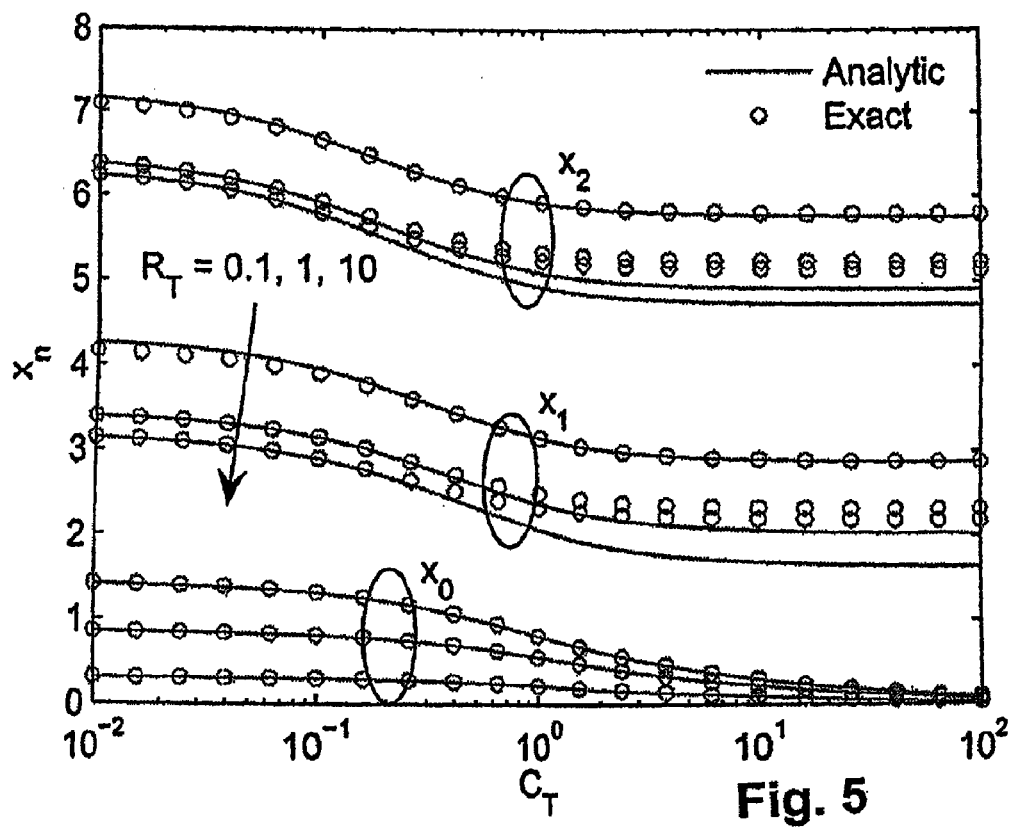
FIG. 5 is a graph showing the solution of equation (3)

FIG. 5 shows the analytic solution of equation (3) as compared with the exact solution for different values of $R_T$ and $C_T$. The accuracy of equation (7) and equation (10) is illustrated in FIG. 5 for different values of $R_T$ and $C_T$. As shown in FIG. 5, the error of the higher order solutions is larger for greater values of $R_T$ and $C_T$. In these cases, the effect of the higher order solutions, however, is negligible.

After solving $x_n$, the poles of an RC interconnect system can be obtained using the following equation (11):

$$p_n = \frac{\theta^2}{RC} = \frac{-x_n^2}{RC}, n = 0, 1, 2, \ldots.$$

Although the solutions used for $x_n$ do not correspond to the exact solutions for $x_n$ (see FIG. 5), the determination of the poles $p_n$ are still considered to be based on an untruncated version of the transfer function because no truncation or approximation of the transfer function itself was used in obtaining these $p_n$ values. Also, the $p_n$ values can be refined using methods such as Newton Raphson, as explained below to obtain exact poles. The residue of the corresponding poles is given by the following equation (12):

$$k_n = \lim_{s \to p_n} \frac{s - p_n}{F(s)}$$
$$= \frac{1}{F'(p_n)}$$
$$= \frac{2x_n/(RC)}{(1 + B - Ax_n^2)\sin x_n + (2A+B)x_n\cos x_n},$$

where $F'(p_n)$ is the derivative of F(s) at $p_n$.

Now an RLC interconnect with a zero driver resistance ($R_d$) will be considered. If $R_d$ is zero, then equation (1) simplifies to the following equation (13):

$$H(s) = \frac{1}{\cosh(\theta) + C_T\theta\sinh(\theta)}.$$

Note that θ also needs to be an imaginary number to make F(s) zero. Similar to the approach for the RC case, assume θ=jx, where x is a real number. The poles of the transfer function should satisfy the following equations (14) and (15):

$$\cos x - C_T x \sin x = 0, \quad (14)$$

or $$x = \frac{\cot x}{C_T}. \quad (15)$$

Figure 6:
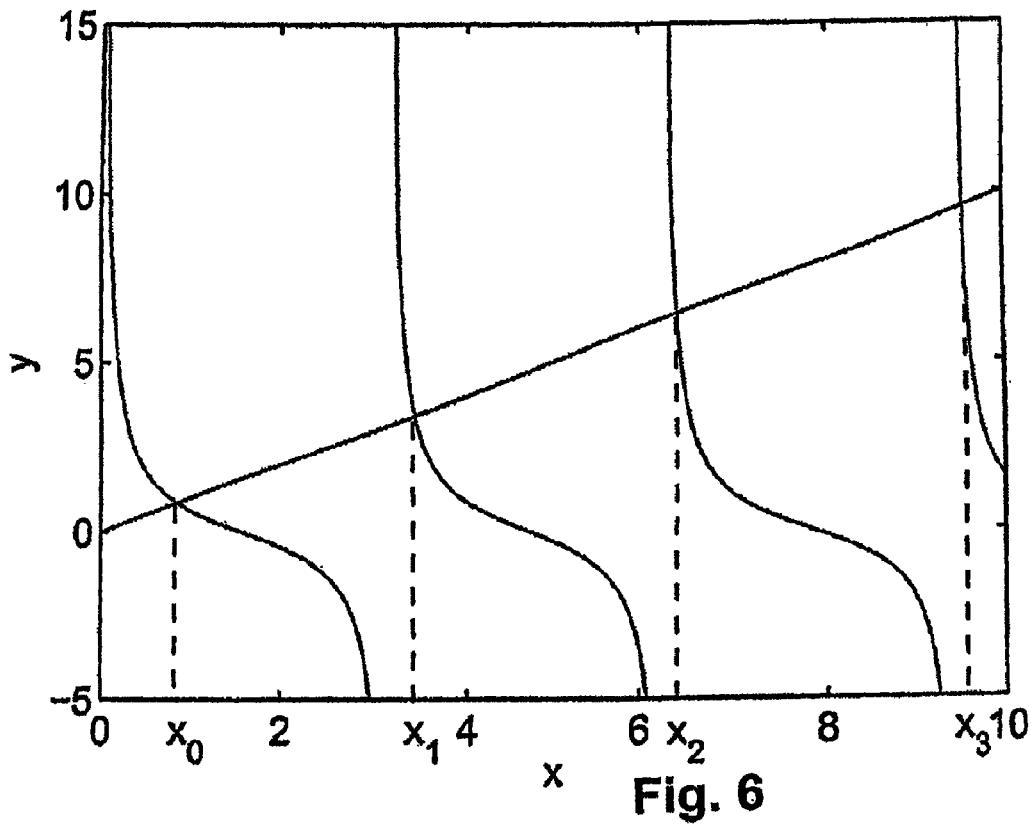
FIG. 6 is a graph showing the roots of equation (15)

FIG. 6 is a graph of the roots of equation (15) when $C_T=1$. The roots of equation (15) are the crossing point of the curves of functions y=x and y=cot $x/C_T$, as shown in FIG. 6.

By applying Taylor series approximations, x can be solved using the following equation (16):

$$x_n = \begin{cases} \sqrt{\dfrac{\frac{1}{2} + C_T - \sqrt{C_T^2 + \frac{1}{3}C_T + \frac{1}{12}}}{\frac{1}{3}C_T + \frac{1}{12}}}, & n=0 \\ \dfrac{(1+C_T)n\pi + \sqrt{(C_T n\pi)^2 + 2 + 4C_T}}{1 + 2C_T}, & n \geq 1 \end{cases}$$

Although equation (16) applies a Taylor series approximation, this is not considered to be a truncation or an approximation of the transfer function itself because equations (14) and (15) do not represent the transfer function or a portion thereof. Note that when $C_T$ approaches zero, equation (14) becomes cos x=0, and the solution $x_n$ approaches $(n+\frac{1}{2})\pi$, where n=0, 1, 2, . . . . In order to capture this trend, equation (16) is revised as the following equation (17):

$$x_n = \begin{cases} \sqrt{\dfrac{\frac{1}{2} + C_T - \sqrt{C_T^2 + \frac{1}{3}C_T + \frac{1}{11.54}}}{\frac{1}{3}C_T + \frac{1}{12}}}, & n=0 \\ \dfrac{(1+C_T)n\pi + \sqrt{(C_T n\pi)^2 + \frac{\pi^2}{4} + 4C_T}}{1 + 2C_T}, & n \geq 1 \end{cases}$$

Figure 7:
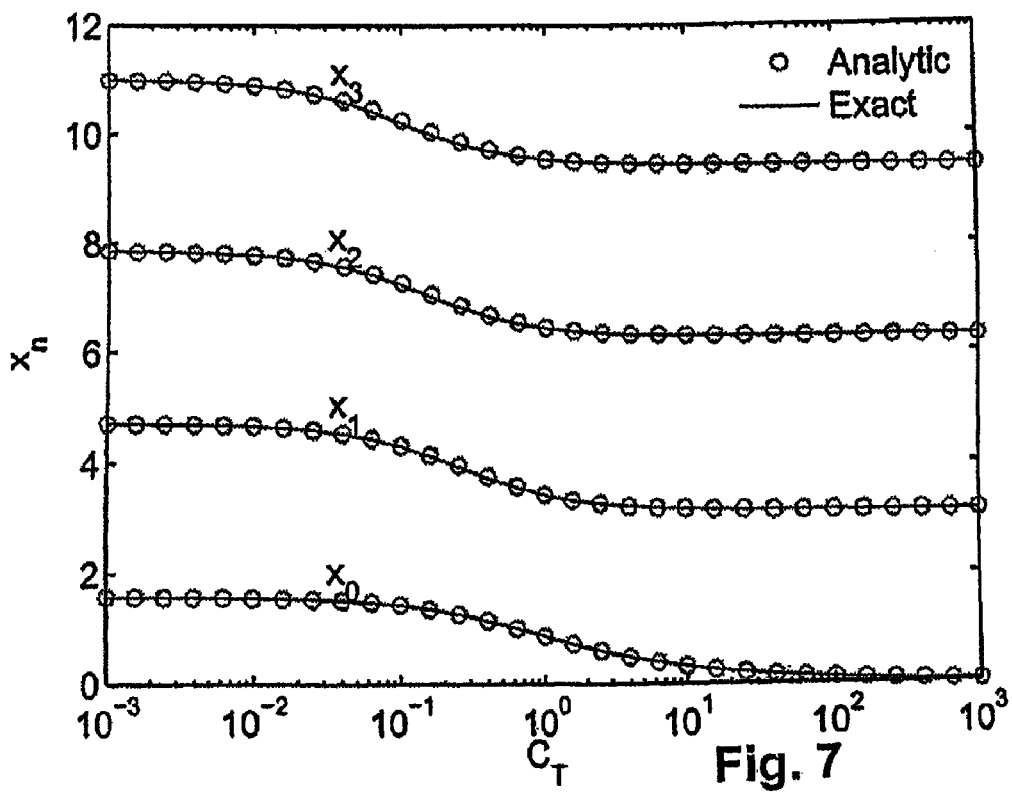
FIG. 7 is a graph comparing exact and analytic solutions of equation (14)

In FIG. 5, the analytic solution of equation (14) is compared with the exact solution for different values of $C_T$. The accuracy of equation (17) is illustrated in FIG. 7 for different values of $C_T$. As shown in FIG. 7, when $C_T$ increases from zero to infinity, $x_n$ decreases from $(n+\frac{1}{2})\pi$ to $n\pi$.

The poles of the transfer function can be obtained from the following equation (18):

$$LCs^2 + RCs = \theta^2 = -x_n^2, n=0, 1, 2, \ldots.$$

Each $x_n$ corresponds to a pair of poles, given by the following equation (19):

$$p_{n,\pm} = \frac{-RC \pm \sqrt{R^2C^2 - 4LCx_n^2}}{2LC}.$$

Although the solutions used for $x_n$ do not exactly correspond to the exact solutions for $x_n$ (see FIG. 7), the poles $p_n$ are still considered to be based on an untruncated version of the transfer function because no truncation or approximation of the transfer function itself was used in obtaining these $p_n$ values. Also, the $p_n$ values can be refined using methods such as Newton Raphson, as explained below to obtain exact poles. The residue of the corresponding poles $k_{n,\pm}$ can be solved as the following equation (20):

$$k_{n,\pm} = \lim_{s \to p_{n,\pm}} \frac{s - p_{n,\pm}}{F(s)}$$
$$= \frac{1}{F'(p_{n,\pm})}$$
$$= \frac{\pm 2x_n}{D[(1 + C_T)\sin x_n + C_T x_n \cos x_n]},$$

where:

$$D = \sqrt{R^2C^2 - 4LCx_n^2}.$$

Figure 8:
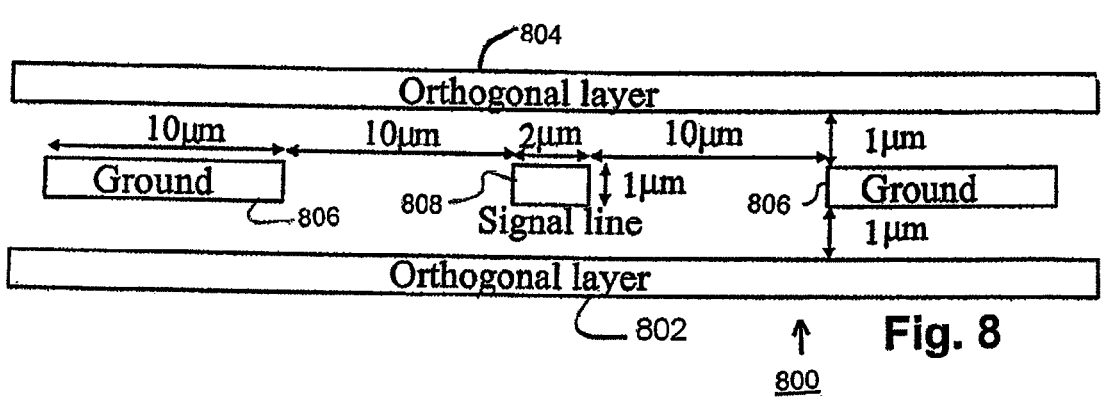
FIG. 8 is a schematic of a wire structure used in transmission line simulation according to the methods of the present invention.

Step and ramp responses will now be developed. From the poles and corresponding residues, the transfer function can be represented as the following equation (21):

$$H(s) = \sum_i \frac{k_i}{s - p_i},$$

where i is the index covering all of the poles. Consider a wire structure example as shown in FIG. 8. Wire structure 800 includes: orthogonal layers 802, 804; Ground 806; and signal line 808. The interconnect parameters per unit length are $R_{int}=12.24$ mΩ/μm, $L_{int}=0.74$ pH/μm, and $C_{int}=0.266$ fF/μm. These values can be extracted from FastHenry and FastCap with a signal frequency of 2 GHz. The amplitude of the transfer function obtained from equation (21) is compared with the exact transfer function for the RC case in FIG. 9A and RLC case with a zero $R_d$ in FIG. 9B, respectively.

Figure 9A:
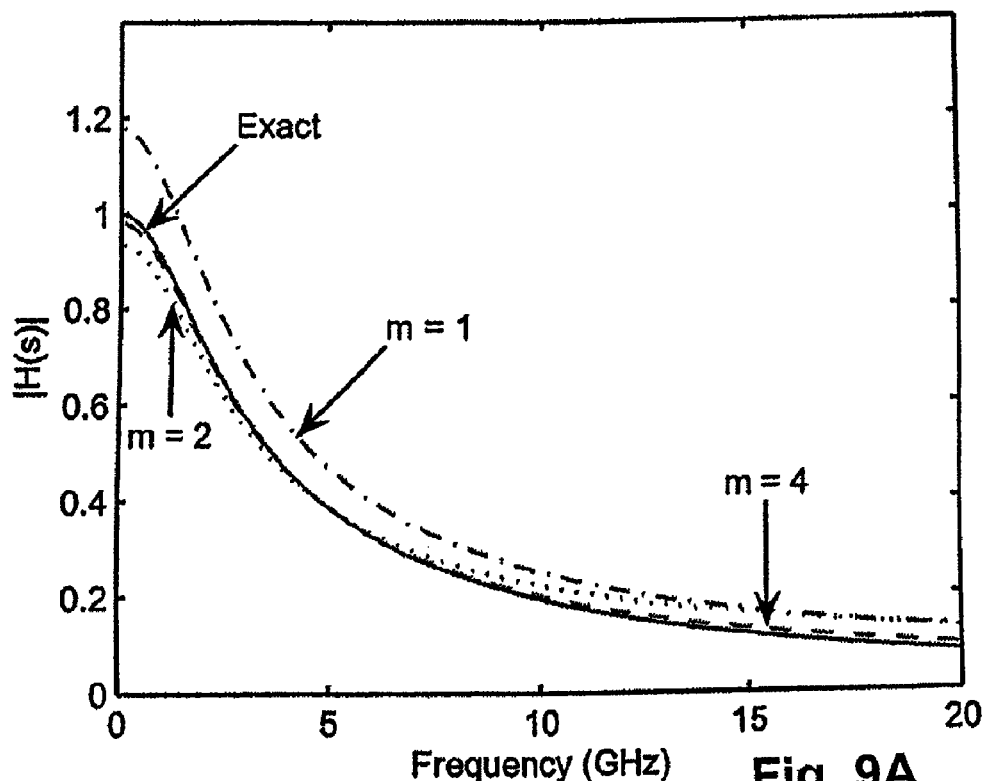
FIGS. 9A and 9B are graphs comparing the results of equation (21) to exact solutions for the RC and RLC with zero driver resistance cases.
Figure 9B:
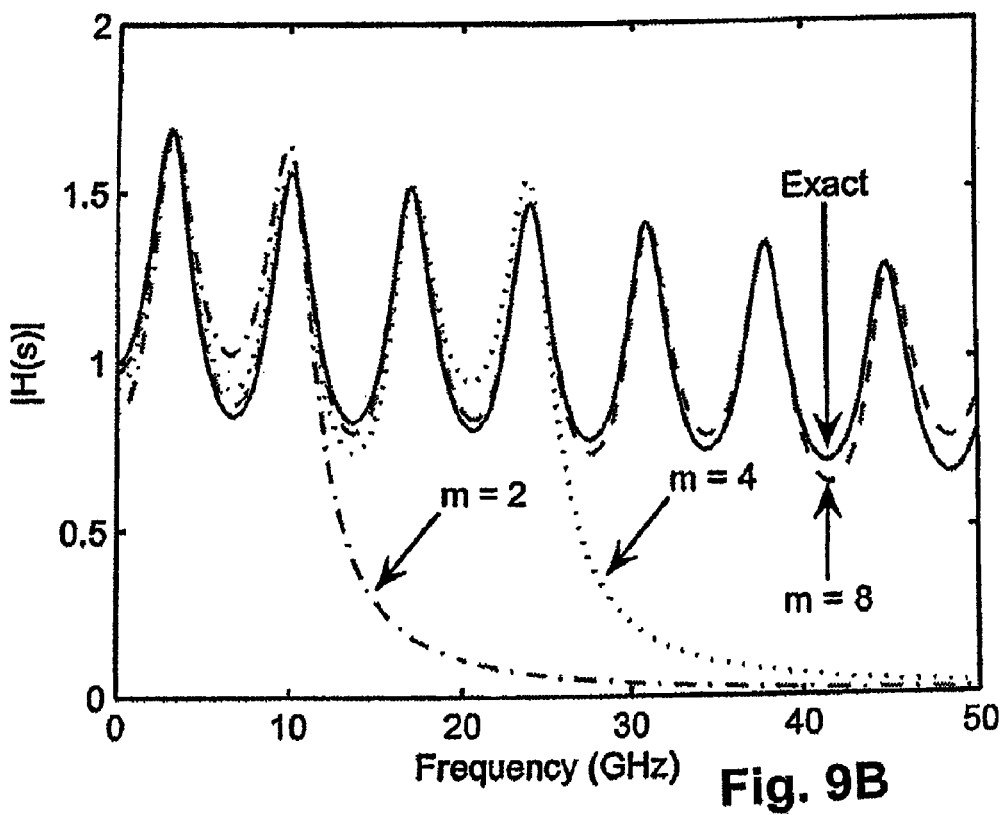

For the graphs of FIGS. 9A and 9B, the wire length is 5 mm and the load capacitance is $C_L=50$ fF. In the graph of FIG. 9A, $R_d=30\Omega$. In FIG. 9A, m is the number of poles considered in the model. In FIG. 9B, m is the number of pole pairs, since the poles in this case are in pairs. As shown in the FIGS. 9A and 9B, the analytic transfer function converges to the exact transfer function with increasing m. As compared with the RC case, more poles are required for the RLC case to obtain an accurate result.

From equation (21): (i) the normalized step response $V_s(t)/V_{dd}$ is given by the following equation (22); (ii) ramp response $V_r(t)/V_{dd}$ is given by equation (23); (iii) the $V_1$ term used in these equations is given by equation (24):

$$\frac{V_s(t)}{V_{dd}} = u(t)\left[1 + \sum_i \left(\frac{k_i}{p_i} e^{p_i t}\right)\right], \quad (22)$$

$$\frac{V_r(t)}{V_{dd}} = V_1(t) - V_1(t - t_r), \quad (23)$$

$$V_1(t) = \frac{u(t)}{t_r}\left[t + m_1 + \sum_i \left(\frac{k_i}{p_i^2} e^{p_i t}\right)\right], \quad (24)$$

In equations (22) and (24), u(t) is the step function. In these equations, the moment information used is given by the following equations (25) and (26):

$$-\sum_i \frac{k_i}{p_i} = m_0 = 1, \quad (25)$$

$$-\sum_i \frac{k_i}{p_i^2} = m_1. \quad (26)$$

For an RC interconnect, the following equation (27) applies:

$$m_1 = -R_d(C+C_L) - R(0.5C+C_L),$$

and for an RLC interconnect with a zero driver resistance, the following equation (28) applies:

$$m_1 = -R(0.5C+C_L).$$

Figure 10A:
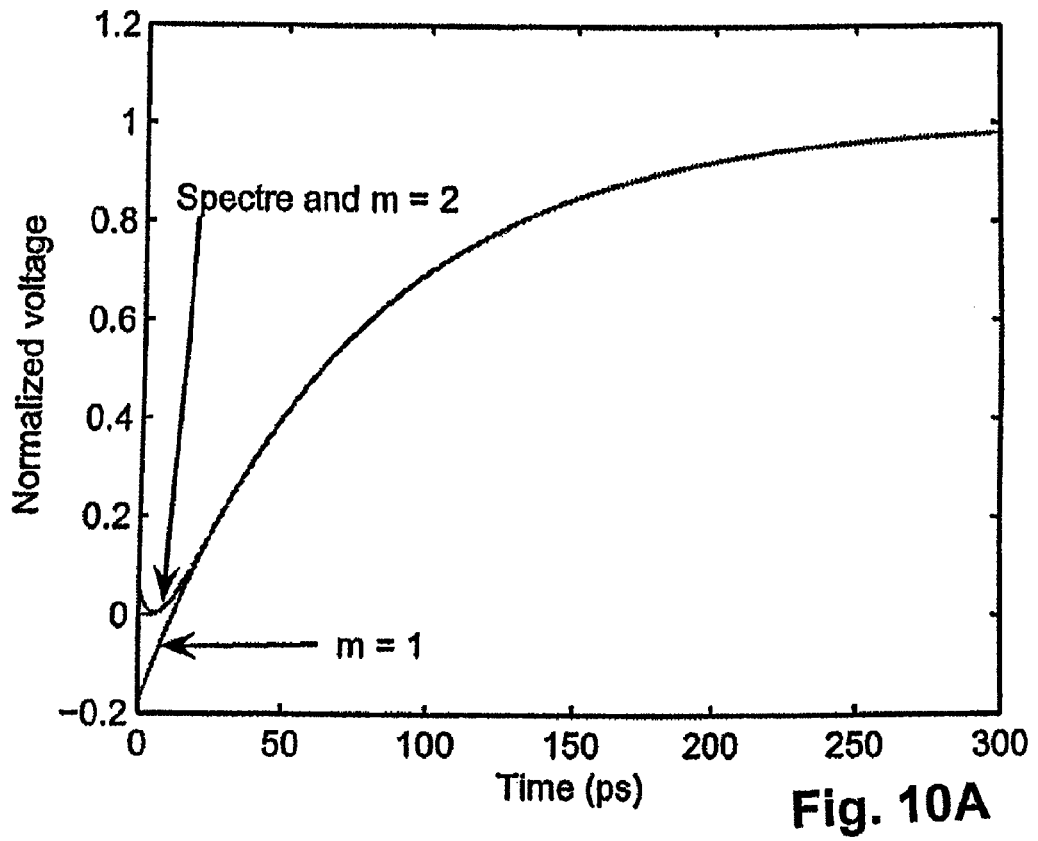
FIGS. 10A to 10D are graphs comparing the direct extracted pole solutions of the present invention to corresponding Spectre simulation based solutions.
Figure 10B:
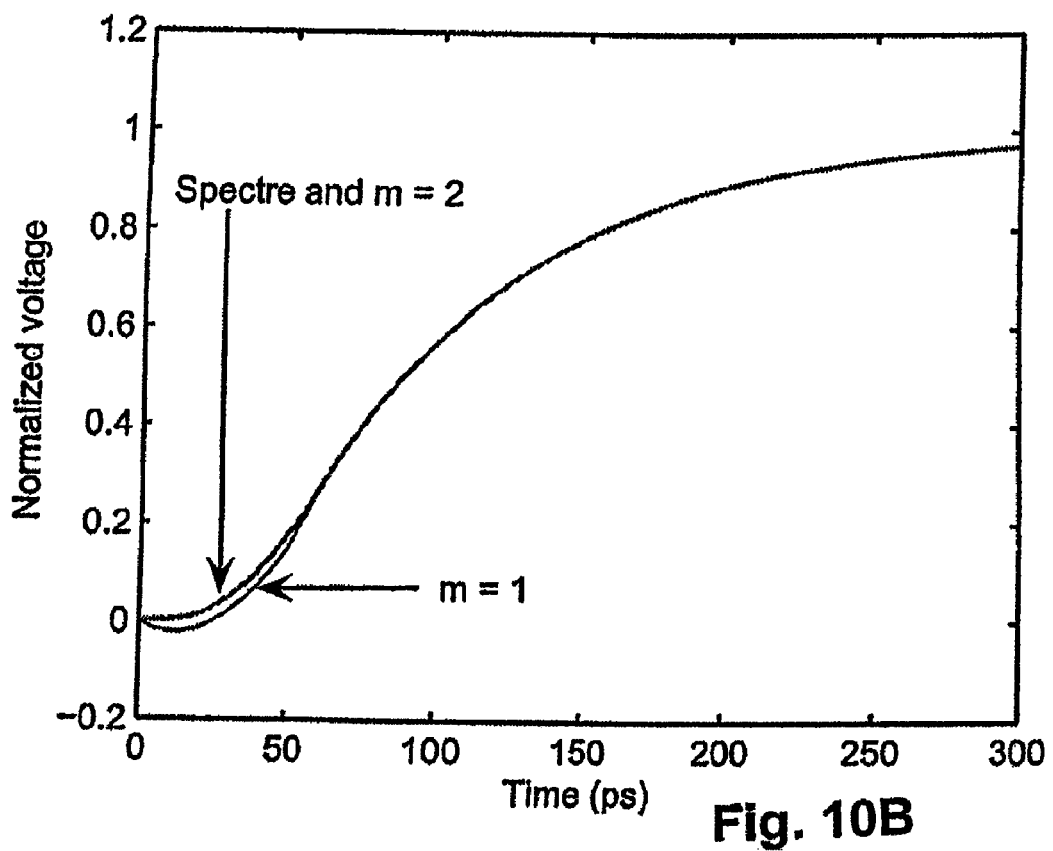
Figure 10C:
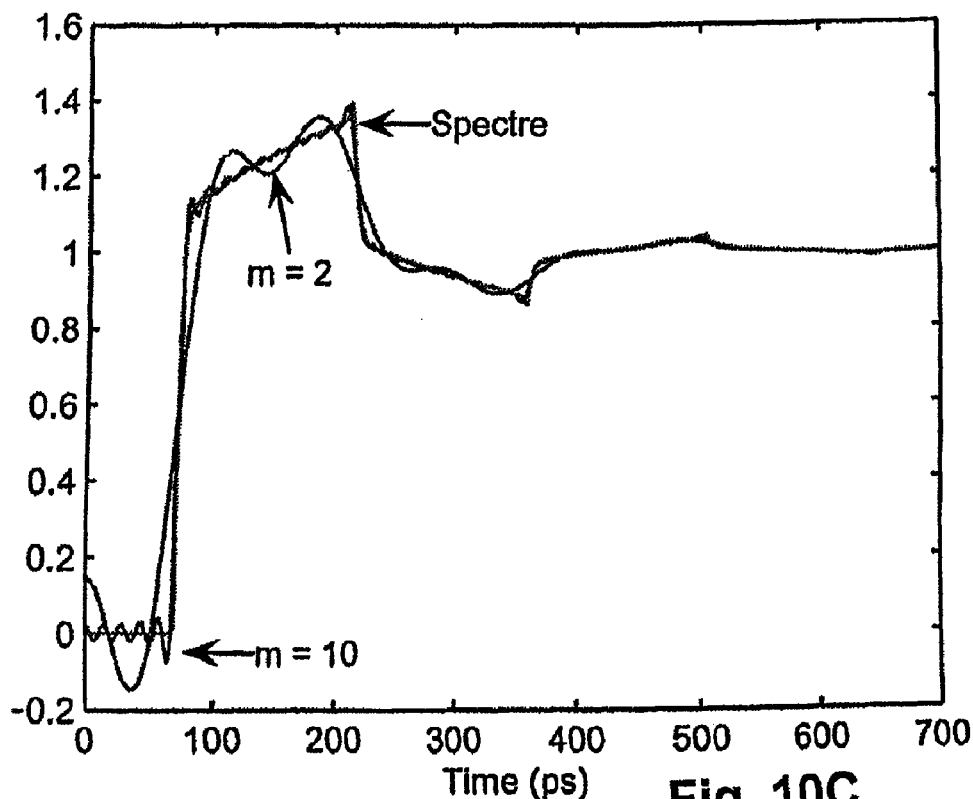
Figure 10D:
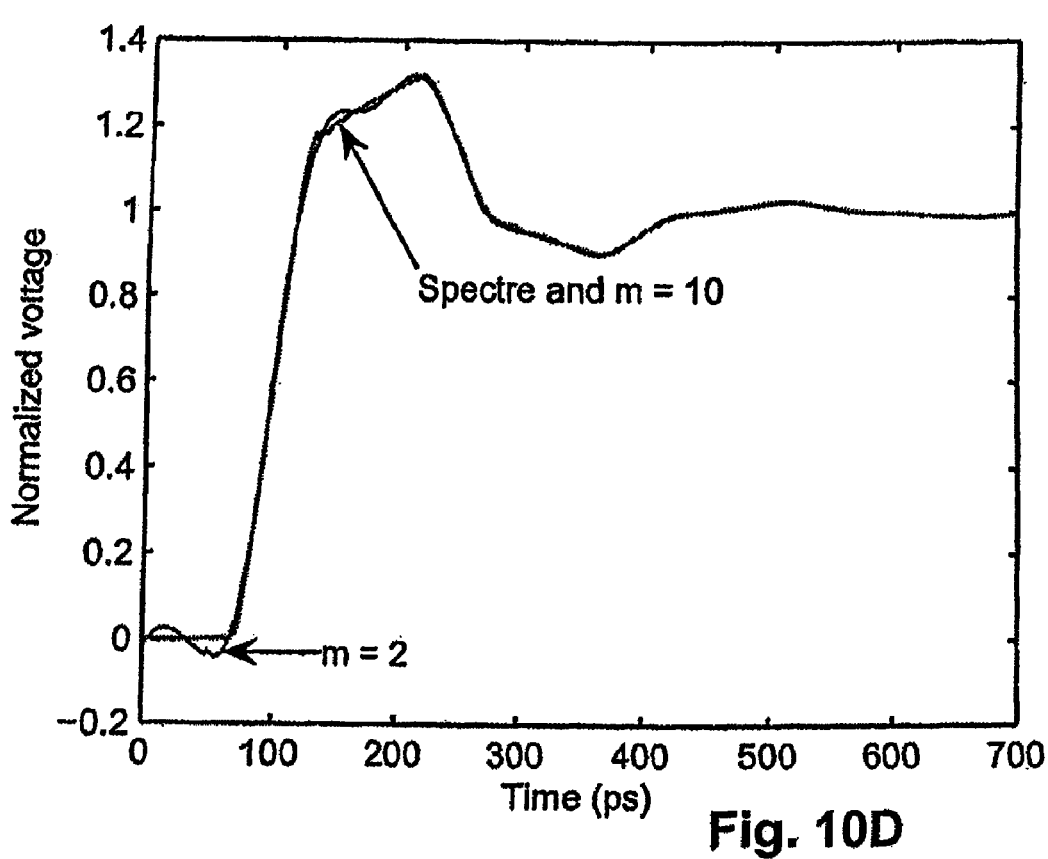

The step and ramp responses obtained from equation (22) and equation (23) are compared with Spectre simulations in FIGS. 10A, 10B, 10C and 10D. In the Spectre simulation, the transmission line is modeled as a series of π-shaped RC or RLC segments. Each segment is 10 μm long. Good agreement between the analytic solution and Spectre simulations is observed. The accuracy of the ramp response is much higher than that of the step response since a ramp signal consists of fewer high frequency components. In FIGS. 10A to 10D, step and ramp response obtained analytically are compared with Spectre simulations as follows: (i) FIG. 10A shows step response, RC case; (ii) FIG. 10B shows ramp response, RC case; (iii) FIG. 10C shows step response, RLC case; and (iii) FIG. 10D shows ramp response, RLC case.

Now, a distributed RLC interconnect with non-zero driver resistance will be considered, and an interconnect simulation with general circuit parameters will be solved. The Newton-Raphson method will be used to determine the exact poles of this simulation. For an interconnect driven by a gate, there are primarily two kinds of approaches for timing analysis.

In the first approach, the driver and the interconnect are separated. The voltage waveform at the gate output is obtained through precharacterized delay and transition time information characterizing the gate. This waveform is applied at the input of the interconnect to obtain the far end response. With increasing inductive effects, more complicated driver output models are required to characterize the reflection behavior of the propagating signals, such as the two-ramp model described in K. Agarwal, D. Sylvester, and D. Blaauw, "An Effective Capacitance Based Driver Output Model for On-Chip RLC Interconnects," Proceedings of the IEEE/ACM Design Automation Conference, pp. 376-381, June 2003 and the three-piece model in L. K. Vakati and J. Wang, "A New Multi-Ramp Driver Model with RLC Interconnect Load," Proceedings of the IEEE International Symposium of Circuits and Systems, pp. V269-V271, May 2004. Recently, several current source models (CSM) have been developed where the nonlinear behavior of the gate is characterized, making the driver output response more accurate. For the first approach, the analytic solution proposed in connections with equations (13) to (20) can be applied directly by representing the driver output voltage response as a piecewise-linear waveform. As mentioned above, it should be kept in mind that these equations (13) to (20) do not truncate or approximate the transfer function itself, which means that this first approach method of determining the poles of an RLC interconnect with driver resistance does not truncate the transfer function and thereby improves accuracy.

In the second approach, the driver and interconnect are analyzed as a single system, where the Thevenin model is generally used, as shown in FIG. 3. In this approach, the interaction between the driver and the interconnect is modeled as a single system. For the second voltage-approach, the method proposed in connection with equations (13) to (20) needs to be improved to include the effect of the driver resistance.

With a system transform, the poles of a general RLC interconnect system will now be solved. In J. Chen, the circuit model as shown in FIG. 3 is mapped into an open-ended interconnect system by matching the moments. Similarly, the interconnect system with a driver resistance can also be mapped into a system without a driver resistance. This mapping may be considered as an approximation of the transfer function for the system, but it is not a truncation of the transfer function for the system. Consider a step signal at the input of the circuit shown in FIG. 3. The height of the initial step at the driver output is $V_{dd}Z_0/(R_d+Z_0)$, where $Z_0=\sqrt{L/C}$ is the characteristic impedance of a lossless line. As described in Y. I. Ismail, E. G. Friedman, and J. L. Neves, "Figures of Merit to Characterize the Importance of On-Chip Inductance," IEEE Transactions on Very Large Scale Integration (VLSI) Systems, Vol. 7, No. 4, pp. 442-449, December 1999, the attenuation coefficient of a transmission line saturates with increasing frequency to the asymptotic value $R/(2Z_0)$. Assume the total interconnect resistance of the new system (without a driver resistance) is R' and the load capacitance is C'$_L$. The amplitude of the initial propagating wave can be matched by the following equation (29):

$$V_{dd}\frac{Z_0}{R_d+Z_0}e^{-\frac{R}{2Z_0}} = V_{dd}e^{-\frac{R'}{2Z_0}},$$

R' can be obtained using the following equation (30):

$$R' = R + 2Z_0\log\left(1+\frac{R_d}{Z_0}\right).$$

The first moments of the two systems can be matched using the following equation (31):

$$-m_1 = R_d(C_L+C) + R(0.5C+C_L) = R'(0.5C+C'_L)$$

C'L can be obtained using the following equation (32):

$$C'_L = \frac{-m_1}{R'} - 0.5C.$$

After this conversion, the method proposed above in connection with equations (13) to (20) can be applied. As mentioned above, it should be kept in mind that these equations (13) to (20) do not truncate or approximate the transfer function itself. Although equations (13) to (20) are applied to an approximated system transfer function in this second approach method, as explained above, a truncated transfer function is never resorted to even in this second approach method. This means that this second approach method of determining the poles of an RLC interconnect with driver resistance does not truncate the transfer function and thereby improves accuracy.

To explain the second approach method in other words, an original system with driver resistance undergoes a system transform to yield a roughly equivalent approximated system having no driver resistance. The poles of this approximated system are then solved with equations (13) to (20). These poles, as determined by equations (13) to (20) will only be approximate poles for the original system with driver resistance, but the Newton Raphson method can be applied, if needed or desired, to refine these approximate poles into exact poles.

Figure 11A:
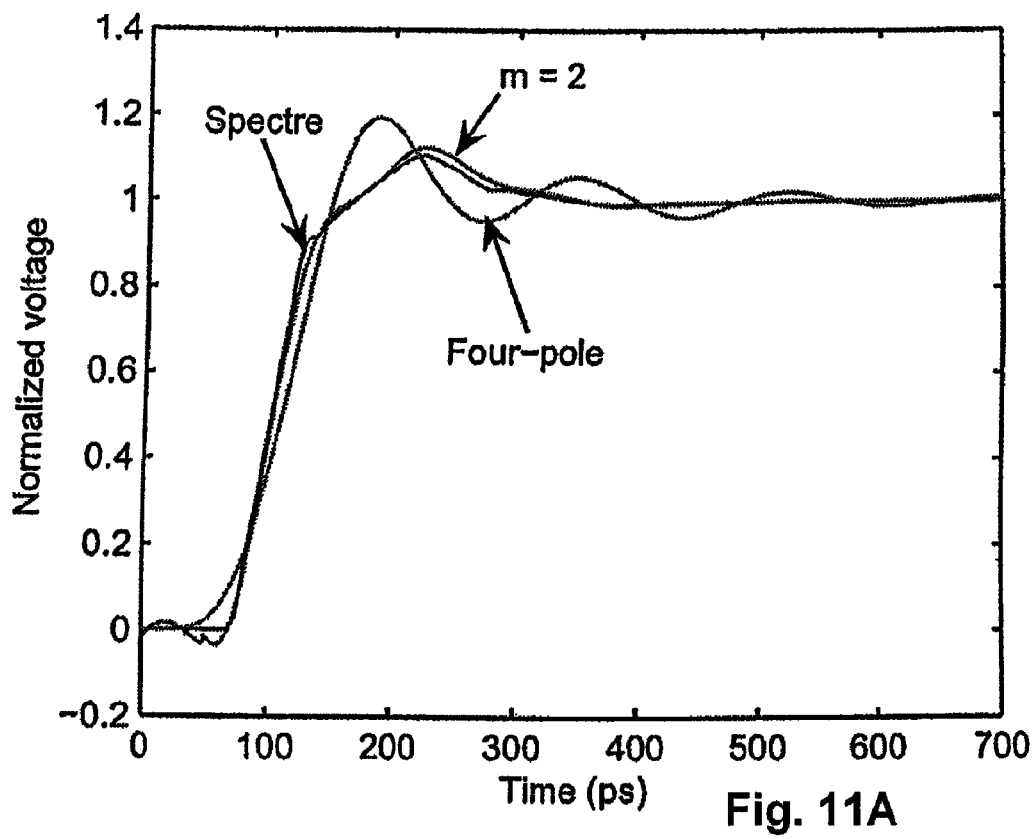
FIGS. 11A and 11B are graphs comparing transient response as obtained using various solution methods.
Figure 11B:
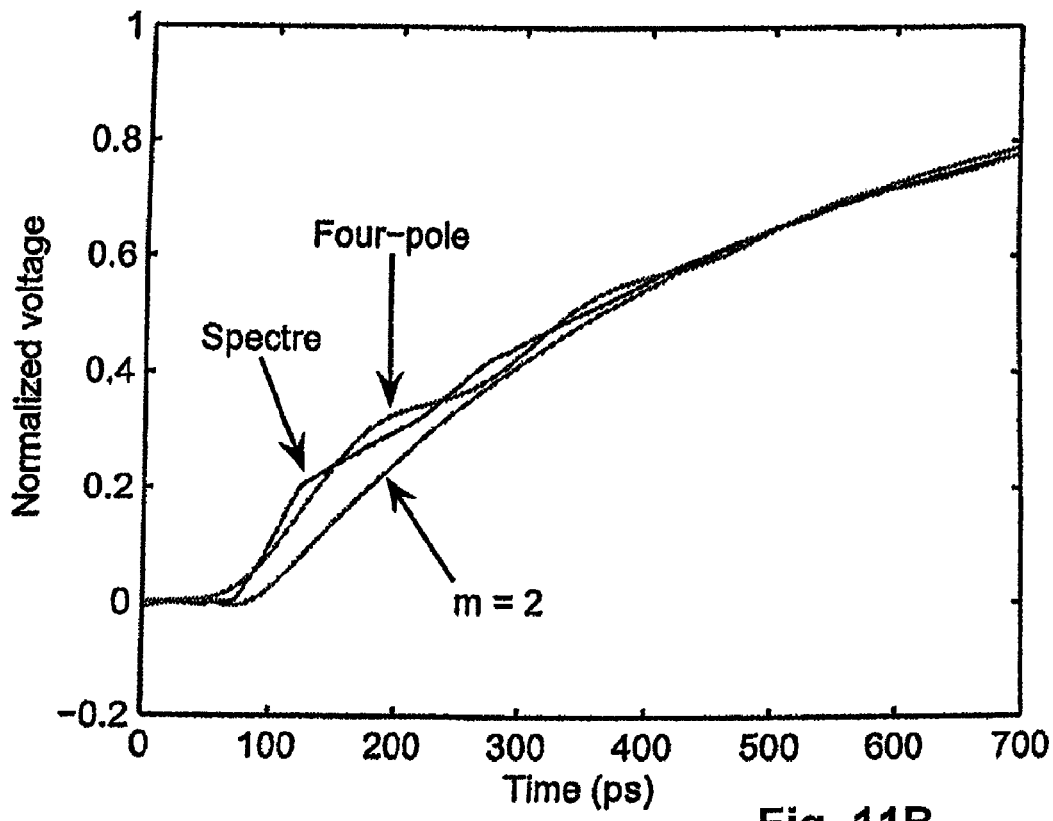

In FIGS. 11A and 11B, the waveform obtained from the proposed model is compared with Spectre simulations and the four-pole model described in Banerjee. FIGS. 11A and 11B compare transient response of a transmission line as obtained with: (i) the model described herein; (ii) four-pole model; and (iii) Spectre simulations. For purposes of this comparison $t_r$=50 ps; $C_L$=50 fF; $R_d$=20Ω (FIG. 11A); and $R_d$=300Ω (FIG. 11B). As mentioned above, this four-pole model of Banerjee is obtained by truncating the denominator of the transfer function to the fourth order; however, no closed-form solution is available for solving the four poles. Note that although both the model described herein and the four-pole model are based on an approximation of the four poles of the system, the model described herein is much more accurate than the four-pole model when inductive effects are important (a system with a small driver resistance), as shown in FIG. 11A. When the system is dominated by the driver resistance, the model described herein is less accurate, particularly at the beginning period of the waveform, as shown in FIG. 11B.

Figure 12:
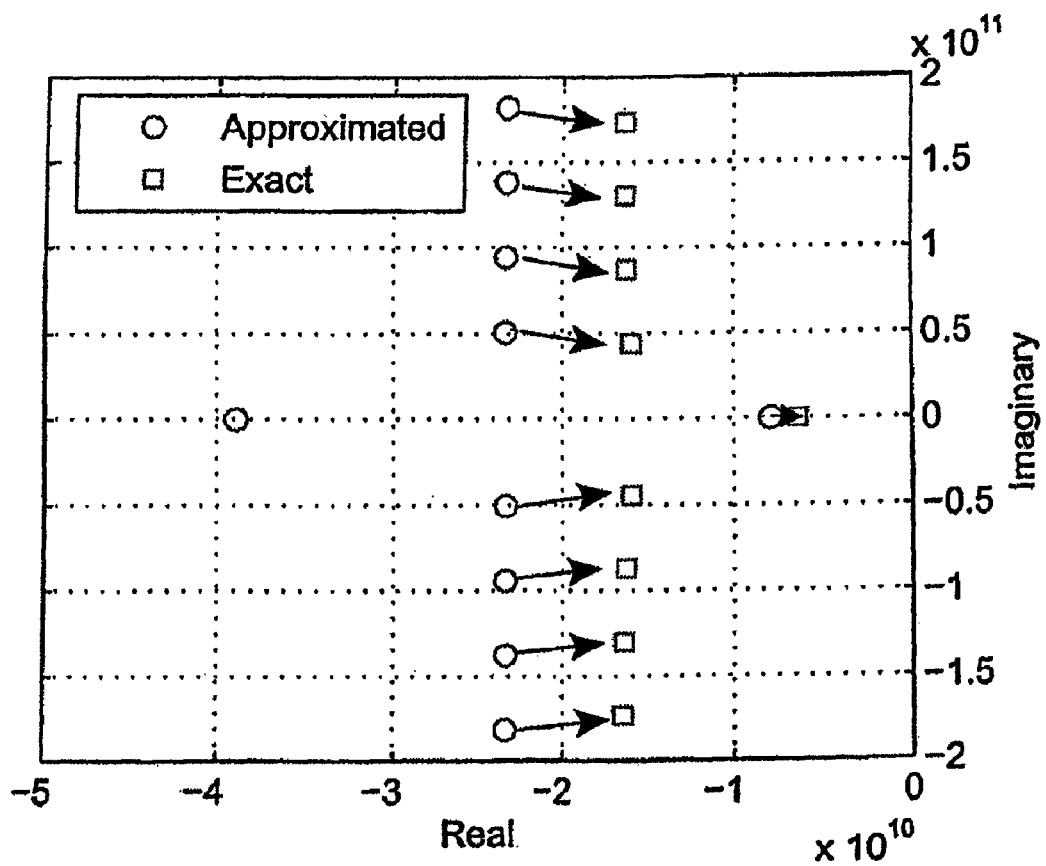
FIG. 12 is a graph comparing the value(s) of analytically obtained poles to corresponding exact poles.

The accuracy of the poles are further improved with the Newton-Raphson method as will now be described. The location of the low order poles obtained analytically is compared with the location of the exact poles in FIG. 12. The graph of FIG. 12 shows mapping between the approximated poles and the exact poles, where $R_d$=100Ω. From FIG. 12, note that there is a one-to-one mapping between the approximated poles and the exact poles. The real pole without an arrow in FIG. 12 should be mapped to a real pole which is out of the range of the graph of FIG. 12. From these approximated poles, the exact poles can be obtained through the Newton-Raphson method, permitting the accuracy of the model to be significantly improved. In general, the number of iterations required for convergence is less than five.

Special attention needs to be paid to those real poles when applying the Newton-Raphson method. For example, the Newton-Raphson process starting from the approximated pole $-3.892 \times 10^{10}$ (the left real pole as shown in FIG. 12) incorrectly converges to the exact pole $-6.396 \times 10^9$ rather than converges to the exact pole outside the range of the figure.

In order to distinguish this case from the double real pole case, the following condition needs to be evaluated. If p is a double real pole of the system, p satisfies the following equation (33):

$$\lim_{s \to p} \frac{F(s)}{s - p} F'(p) = 0.$$

For systems with multiple real poles, the system is dominated by the real pole with the smallest magnitude and the effect of the other real poles can be ignored, unless these poles are close to the dominant pole. The distance between the other real poles and the dominant real pole is related to the value of $F'(p_d)$, where $p_d$ is the dominant pole. If there is another pole $p_x$ which is close to $p_d$, $F'(p_d)$ should be small. When $p_x$ approaches $p_d$, the value of $F'(p_d)$ approaches zero. In the limit, $p_x=p_d$, $p_d$ is a double pole, and $F'(p_d)=0$, as expressed in equation (33).

Pseudo-code for generating the exact poles of a single interconnect system is shown in FIG. 13. In FIG. 13, the function Newton_Raphson( ) is the Newton-Raphson converging process starting with the input argument. In FIG. 13, the variable over_damped is used to indicate whether the system is overdamped or not. For overdamped systems, the higher order real poles (with n>0) are ignored. A threshold value $F_{th}$ is set for $F'(p)$, which is used to indicate the distance between other high order real poles and the dominant real pole.

After the dominant real pole (if the system has real poles, the dominant real pole is always $p_{0,+}$) is determined, $F'(p_{0,+})$ is evaluated. F(s) can be represented by the poles as set forth in the following equation (34):

$$F(s) = \prod_{n=0}^{\infty} \left(1 - \frac{s}{p_{n,+}}\right)\left(1 - \frac{s}{p_{n,-}}\right).$$

From equation (34), equation (35) is obtained as follows:

$$F'(p_{0,+}) = \frac{-1}{p_{0,+}}\left(1 - \frac{p_{0,+}}{p_{0,-}}\right)\prod_{n=1}^{\infty}\left(1 - \frac{p_{0,+}}{p_{n,+}}\right)\left(1 - \frac{p_{0,+}}{p_{n,-}}\right) < \frac{-1}{p_{0,+}}\left(1 - \frac{p_{0,+}}{p_{0,-}}\right).$$

If $|p_{0,-}|>2|p_{0,+}|$, $F'(p_{0,+})<-0.5/p_{0,+}$. With some overhead, $F_{th}$ is determined as $-0.3/p_{0,+}$. If $F'(p_{0,+})<F_{th}$, which means pole $p_{0,-}$ is close to $p_{0,+}$, a Newton_Raphson process is launched from point $2p_{0,+}$ to determine $p_{0,-}$. Otherwise, the Newton_Raphson process is launched from point $5p_{0,+}$ to determine $p_{0,-}$. If the process does not converge or incorrectly converges to $p_{0,+}$, which means the true value of $|p_{0,-}|$ is greater than $5|p_{0,+}|$, the effect of $p_{0,-}$ can be ignored. For the double pole case, the process of solving the residue requires the second order derivative of F(s), which is complicated. The code produces an output message if a double pole occurs. In this case, a small change in the circuit parameters can avoid a double pole, while the effect on the output signal waveform caused by this parameter change cannot be distinguished. After the exact poles are extracted, a step or ramp response is constructed from equation (22) or equation (23). In order to eliminate the artificial discontinuity of the waveform at the end of the input rising edge, the first moment $m_1$ in equation (24) is calculated from the truncated summation, as shown in the left side of equation (26), rather than the exact value of $0.5R'C+R'C'_L$.

Figure 14A:
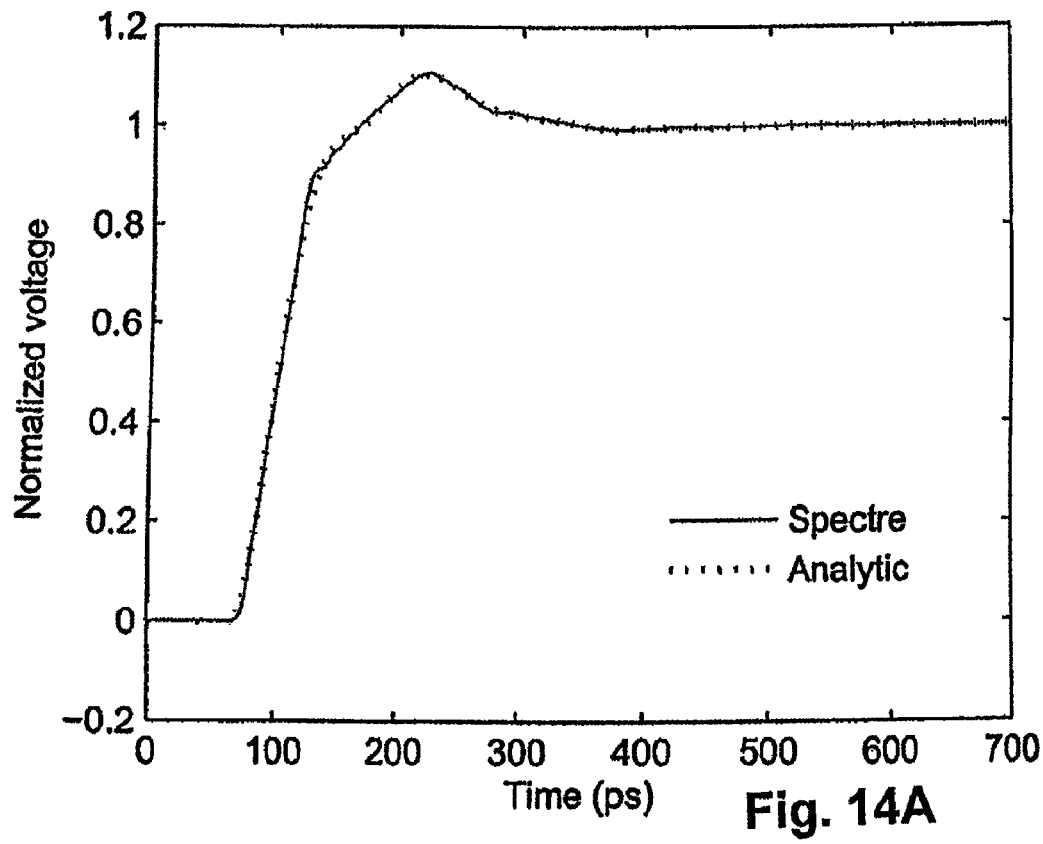
FIGS. 14A and 14B are graphs comparing transient response as obtained using methods of the present invention to corresponding Spectre simulation.
Figure 14B:
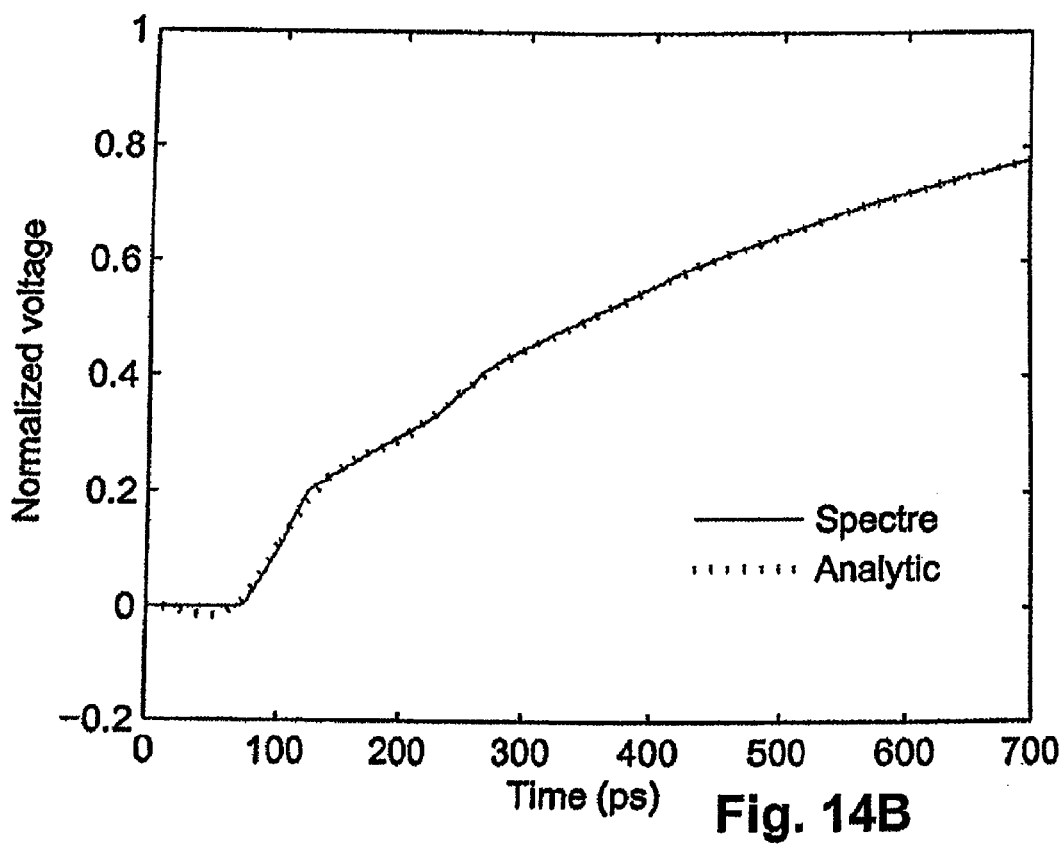

For the same circuit examples used in FIGS. 11A and 11B, the waveform obtained from the improved method is re-plotted in FIGS. 14A and 14B. In FIGS. 14A and 14B, transient response of transmission line obtained with the improved analytic method as compared with Spectre simulations, where m=2; $R_d$=20Ω (FIG. 14A); and $R_d$=300Ω (FIG. 14B). From FIGS. 14A and 14B, the difference between the analytic waveforms and Spectre simulations is difficult to distinguish except for the period of the initial time-of-flight.

The accuracy and efficiency of the simulation methods of the present invention will now be discussed. The 50% delay, 10%-to-90% rise time, and the normalized overshoot obtained from the proposed model are compared in FIGS. 15A and 15B with Spectre simulations for different input rise times (the input rise time is determined from 0 to $V_{dd}$). FIGS.

Figure 15A:
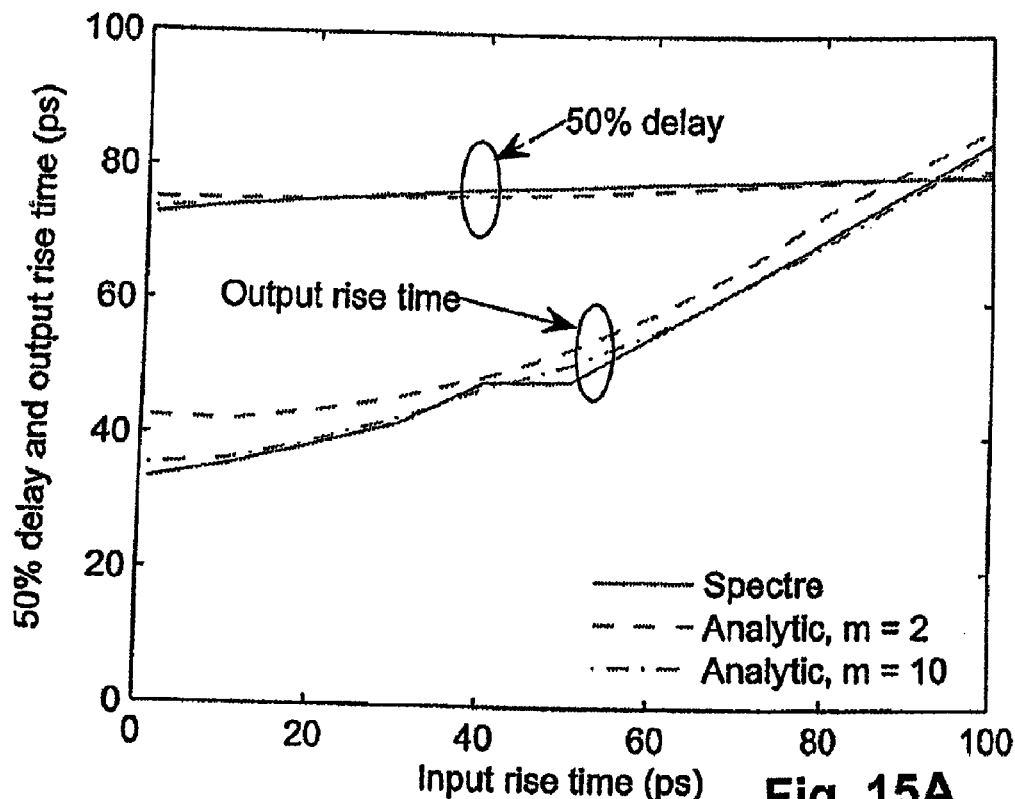
FIGS. 15A and 15B are graphs comparing various far end characteristics obtained using methods of the present invention to corresponding Spectre simulation.
Figure 15B:
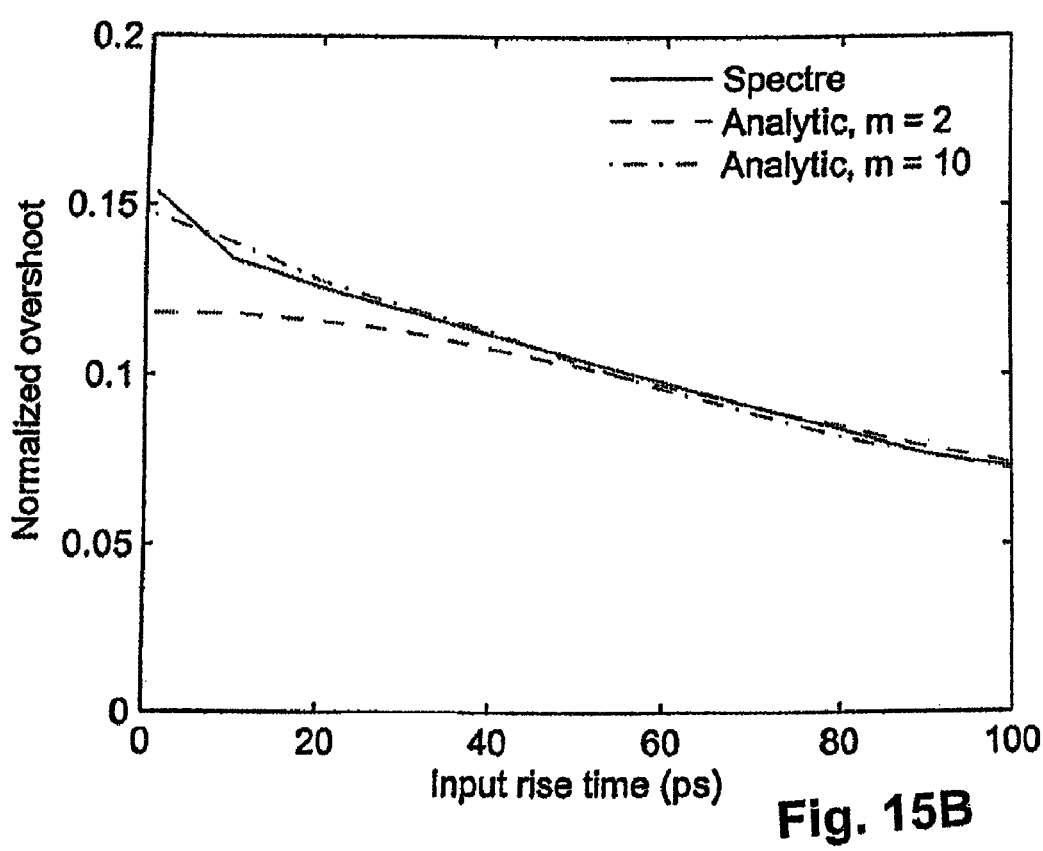

15A and 15B compare the 50% delay, 10%-to-90% output rise time, and the normalized overshoot obtained from the methods of the present invention and corresponding Spectre simulations, where $R_d=20\Omega$, $C_L=50$ fF, and $l=5$ mm. FIG. 15A shows delay and rise time. FIG. 15B shows overshoot.

Since the signal delay is generally determined by the low frequency components, two pairs of poles provide a sufficiently accurate delay estimation. The average error is 1% for different input rise times. For the output rise time and overshoot, the error is larger for smaller input rise times. The error decreases with increasing input rise time, since the output rise time and overshoot are closely related to the high frequency components (a signal with a shorter rise time consists of additional high frequency components). The average error with two pairs of poles is 9.5% for the output rise time and 5.5% for the overshoot. When the number of pole pairs increases to ten, these two average errors decrease to 2.0% and 1.9%, respectively.

The computational complexity of the proposed method is approximately proportional to the number of pole pairs. These experiments have been performed on a SunBlade1500 workstation. The time required for Spectre to perform a 700 ps transient simulation (250 time steps) is 1.8 seconds. The simulation according to the present invention was implemented with Matlab. The comparable run time is 3.1 ms for m=2 and 10.9 ms for m=10, thereby demonstrating the computational efficiency of the present invention. To achieve an accuracy similar to the proposed model (m=2), more than 12 poles are required in the traditional moment matching method. Since there are no closed-form solutions for solving the poles from the moments, the computational complexity of the moment matching method is higher as compared with the proposed method. Specifically, the run time for the moment matching method with 12 poles is 13.5 ms as compared to 3.1 ms for the method methods of the present invention where m=2. Furthermore, the moment matching method suffers numerical stability problems with high order approximations.

Figure 16A:
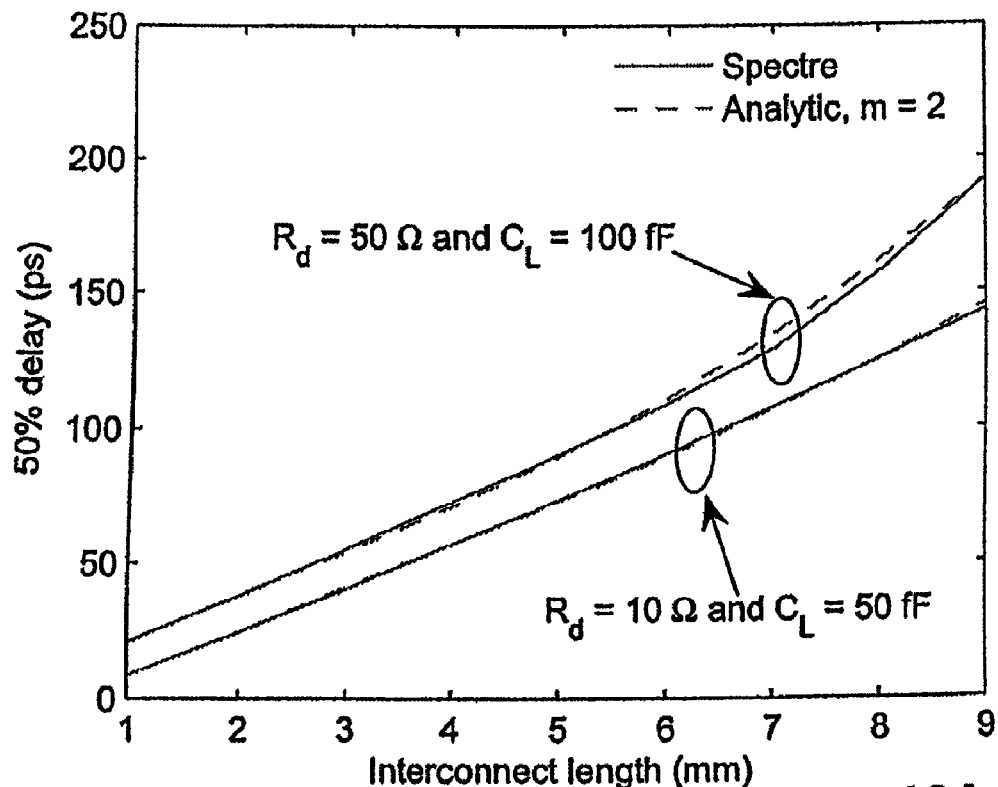
FIGS. 16A and 16B are graphs comparing various 50% delay and 10%-to-90% rise time obtained using methods of the present invention to corresponding Spectre simulation.
Figure 16B:
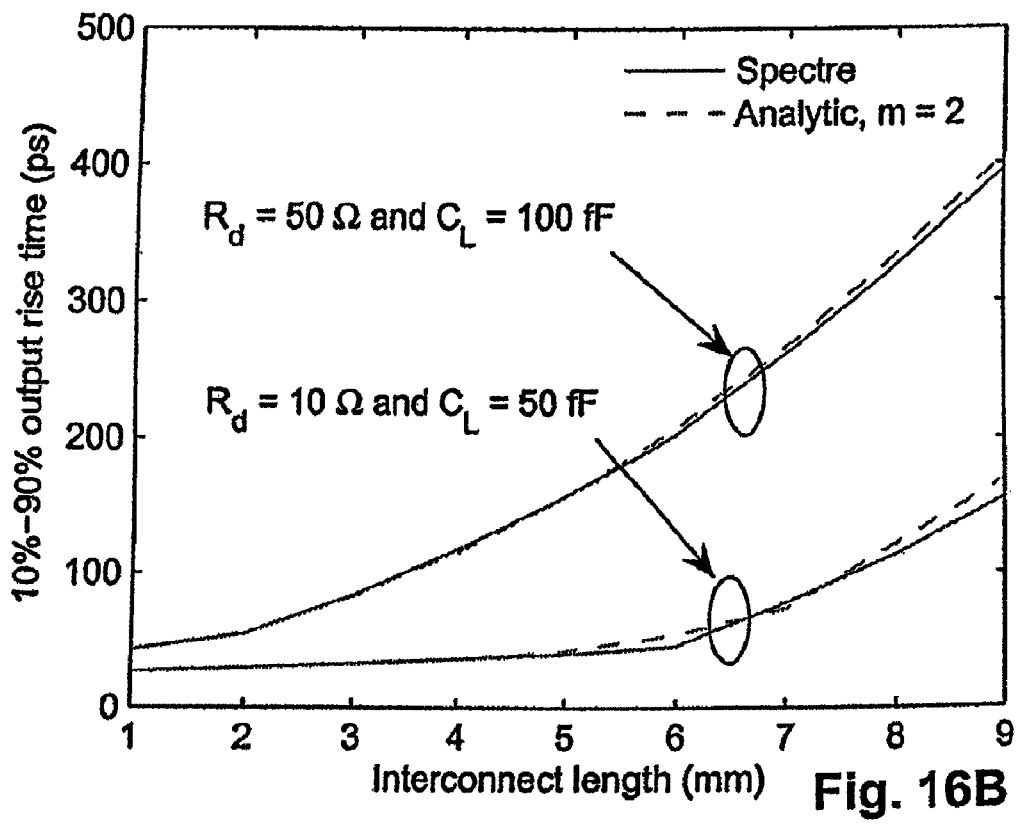

The accuracy of the methods of the present invention are also verified for different interconnect lengths and illustrated in FIGS. 16A and 16B. FIGS. 16A and 16B compare the 50% delay and 10%-to-90% output rise time obtained from the methods of the present invention to corresponding Spectre simulations, where $t_r=50$ ps. FIG. 16A shows 50% delay. FIG. 16B shows 10%-to-90% output rise time.

Frequency dependent effects will now be discussed. Both interconnect inductance and resistance are a function of frequency. This frequency dependent interconnect impedance affects the signal waveform, particularly for those signals containing a greater number of high frequency components. From equation (30), the contribution of the driver resistance to the effective interconnect resistance is $R_{d\_eff}=2Z_0 \log(1+R_d/Z_0)$, which is frequency independent (the frequency dependence due to $Z_0$ is ignored, and the $Z_0$ used here is determined at DC). The effective load capacitance is also determined at DC, as shown in equation (32). Considering the effect of the driver resistance and the frequency dependence of R and L of the interconnect, the effective propagation coefficient θ is given by equation (36):

$$\theta = \sqrt{[R_{d\_eff} + R(s) + L(s)s]Cs}. \quad (36)$$

For different functional forms of R(s) and L(s), the poles of the transfer function of an interconnect can be obtained by solving equation (36). Closed-form solutions may also be available depending upon the expressions of R(s) and L(s).

The frequency dependent impedance can be modeled by ladder structures of frequency-independent elements. These ladder structures are particularly suitable to capture skin effects. A two stage ladder structure is adopted for simplicity, in the exemplary embodiment of shown in FIG. 17 which shows a segment of interconnect with length Δl. Since the frequency dependent effect is naturally more significant at high frequencies, a wider interconnect is adopted here as an example so that additional high frequency components can propagate across the interconnect, distinguishing the frequency dependent effects. The signal wire width is 10 μm, the space between the signal line and ground is 5 μm, and the remaining geometric parameters are the same as depicted in FIG. 8. The parameters in the ladder structure are calculated by matching the DC and high frequency resistance and inductance of the ladder structure with the extracted values. Since the resistance of the interconnect does not saturate at high frequencies, a value of 40 is assumed as the high frequency resistance in this example, resulting in the following parameters: $R_0=40\Omega$, $R_1=28.1\Omega$, $L_0=1.9$ nH, and $L_1=1.12$ nH. The DC impedance is $R_{dc}=16.5$, $L_{dc}=2.287$ nH, and $C=4.18$ pF.

Figure 18A:
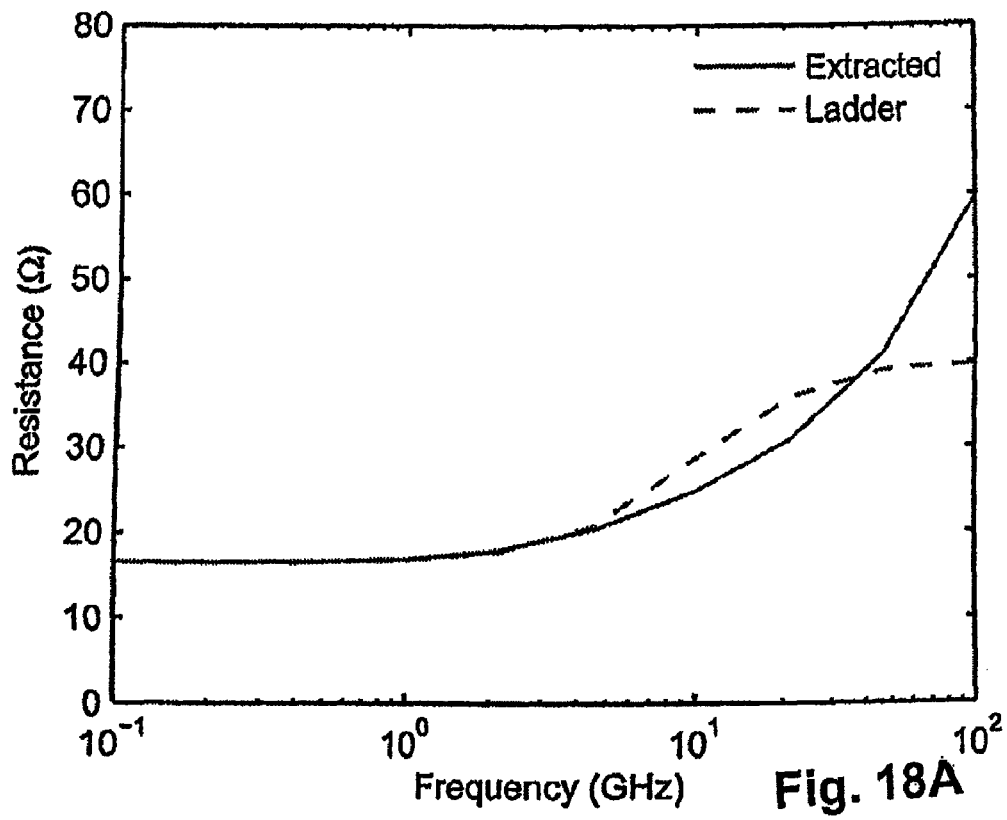
FIGS. 18A and 18B are graphs showing frequency dependent impedance of an interconnect.
Figure 18B:
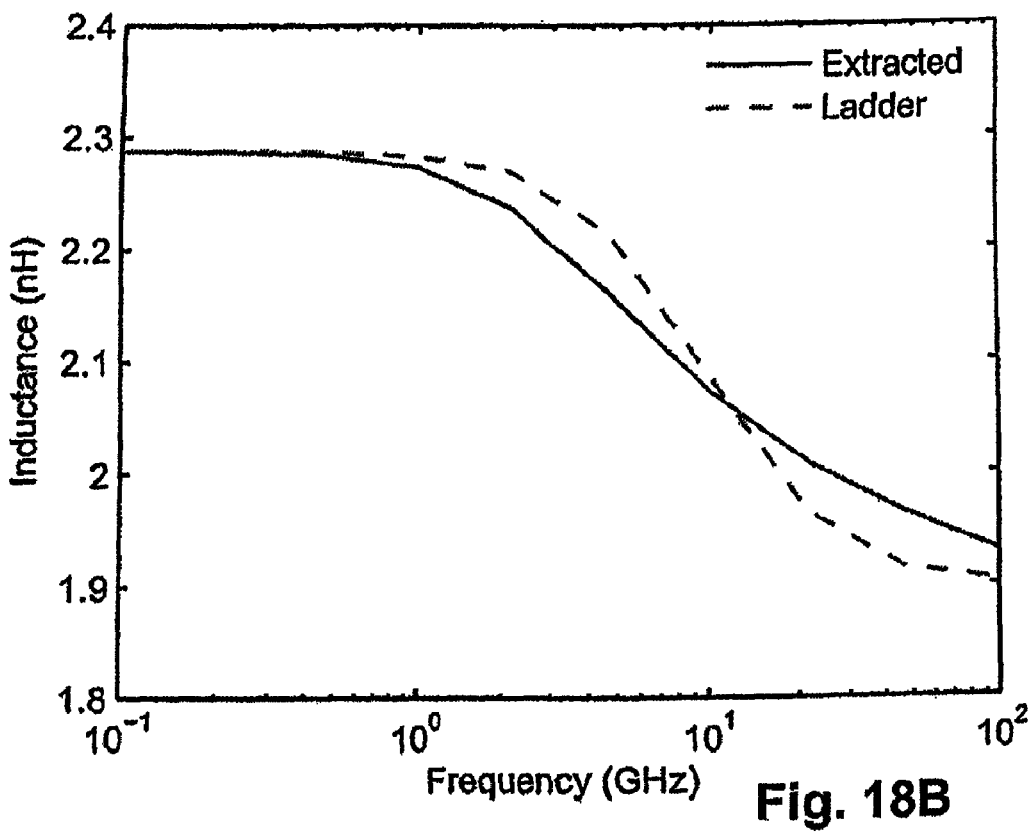

The resistance and inductance of the ladder approximation are compared with the extracted values in FIGS. 18A and 18B. FIGS. 18A and B show frequency dependent impedance of an interconnect with a length of 5 mm. FIG. 18A shows resistance, and FIG. 18B shows inductance. With this ladder approximation, the expression used to solve the poles of the system are given by the following equation (37):

$$\left[R_{d\_eff} + L_0 s + \frac{R_0(R_1+L_1 s)}{R_0+R_1+L_1 s}\right]Cs = \theta^2 = -x_n^2. \quad (37)$$

The poles can be analytically solved by the following equations (38) to (44):

$$p_{n,\pm} = -\frac{a_2}{3} - \frac{X}{2} \pm \frac{\sqrt{3}}{2}i\sqrt{X^2+4Q},$$

$$Q = \frac{3a_1-a_2^2}{9},$$

$$P = \frac{9a_1 a_2 - 27a_0 - 2a_2^3}{54},$$

$$X = \sqrt[3]{P+\sqrt{Q^3+P^2}} + \sqrt[3]{P-\sqrt{Q^3+P^2}},$$

$$a_2 = \frac{L_0 R_0 + L_0 R_1 + R_0 L_1 + L_1 R_{d\_eff}}{L_0 L_1},$$

$$a_1 = \frac{R_0 R_1 C + (R_0+R_1)R_{d\_eff}C + x_n^2 L_1}{L_0 L_1 C},$$

$$a_0 = \frac{(R_0+R_1)x_n^2}{L_0 L_1 C}.$$

Figure 19:
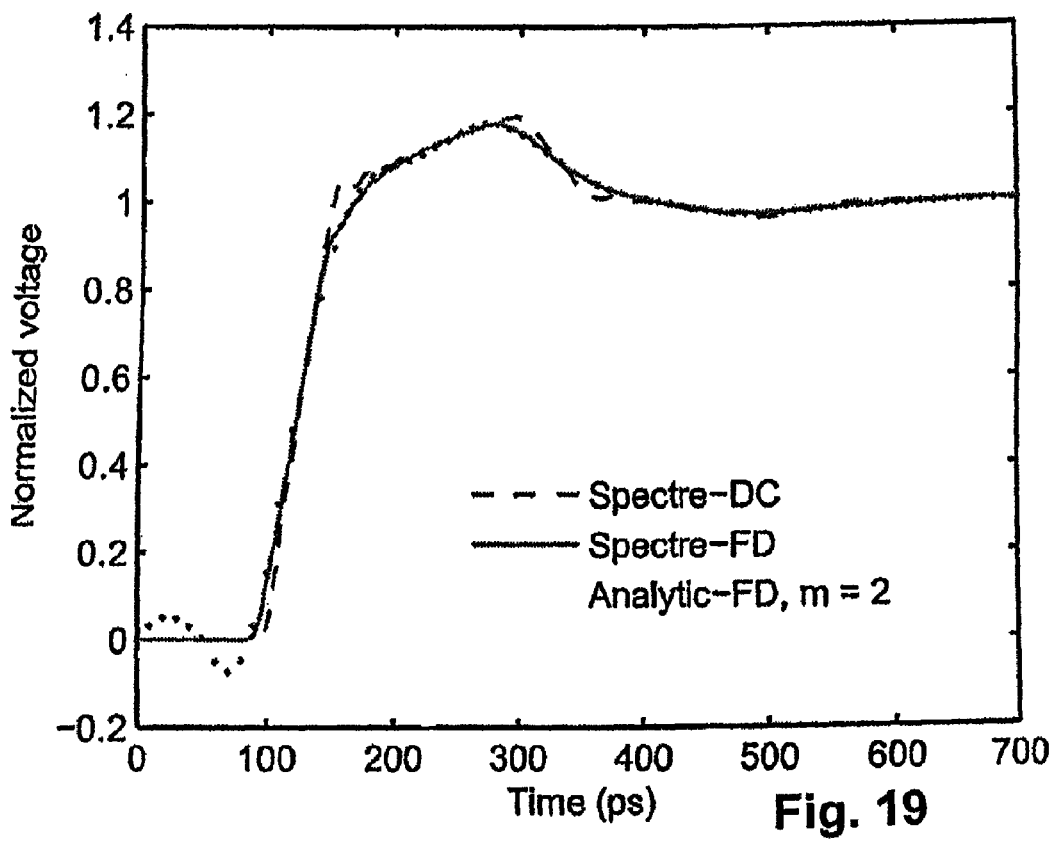
FIG. 19 is a graph comparing waveforms obtained with and without consideration of frequency dependent effects.
Figure 20:
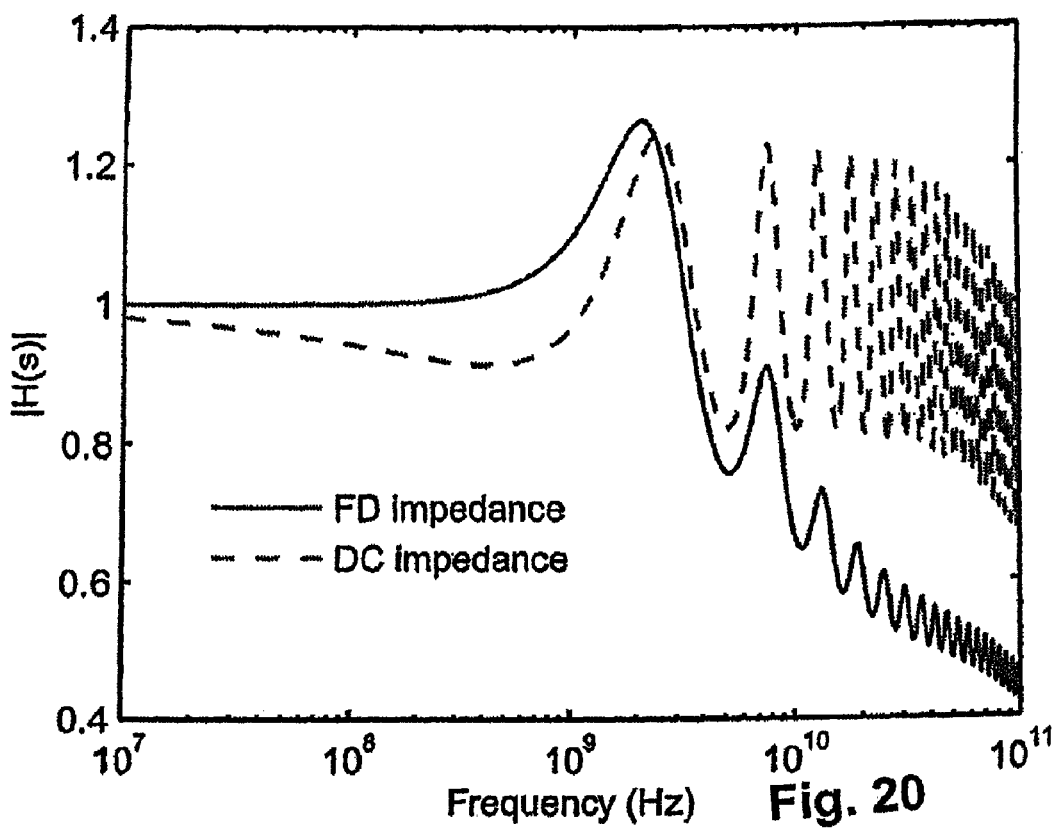
FIG. 20 is a graph comparing transfer functions obtained with and without consideration of frequency dependent effects.

From equation (38), the Newton-Raphson method can be applied to solve the exact poles as discussed above in connection with FIG. 13. In FIG. 19, the output signal waveforms are compared for the DC impedance case and the frequency dependent (FD) impedance case. FIG. 19 compares the output signal waveforms with and without the frequency dependent effect, where $R_d=10\Omega$, $C_L=50$ pF, and $t_r=50$ ps. As shown in FIG. 19, by considering the FD effect, additional high frequency components are suppressed, making the waveform smoother since the high frequency components experience much greater attenuation due to the increasing interconnect resistance, as shown in FIG. 20. FIG. 20 compares transfer functions with and without the frequency dependent effect, where $R_d=10\Omega$ and $C_L=50$ pF. For the high frequency related waveform properties, such as the rise time and overshoot, the FD effect should be considered. For low frequency related waveform properties, such as delay, the FD effect can be neglected. The run time of the Spectre simulation (700 ps, 225 time steps) is 2.45 s and the run time for the corresponding analytic method according to the present invention (with m=2) is 3.8 ms. This represents three orders of magnitude improvement in computational time.

By extracting the exact poles, an efficient method for determining the transient output response of a distributed RLC interconnect can be achieved according to the present invention. Also, far end response characteristics can be more accurately and/or precisely determined by using the exact poles. Two pairs of poles can provide an accurate delay estimate exhibiting an average error of 1% as compared with Spectre simulations. For high frequency related waveform properties, such as the rise time and overshoot, an average error of less than 2% can be obtained with ten pairs of poles. The computational complexity of the proposed method is proportional to the number of pole pairs. By using a ladder structure, frequency dependent effects can also be included in the methods of the present invention. Excellent agreement is observed between the proposed model and Spectre simulations.

Definitions

The following definitions are provided to facilitate claim interpretation and claim construction:

Present invention: means at least some embodiments of the present invention; references to various feature(s) of the "present invention" throughout this document do not mean that all claimed embodiments or methods include the referenced feature(s).

First, second, third, etc. ("ordinals"): Unless otherwise noted, ordinals only serve to distinguish or identify (e.g., various members of a group); the mere use of ordinals implies neither a consecutive numerical limit nor a serial limitation.

Far End Response Characteristic(s): far end response characteristic(s) include, but are not necessarily limited to, frequency dependent effects, step response, ramp response, delay, 50% delay, rise time, 10% to 90% rise time, overshoot and normalized overshoot.

RLC Interconnect: an RLC interconnect or an RC interconnect.

Determine/Determining: determining precisely and/or estimating.

Simulating/simulation: this refers to mathematical modeling of a conductor, regardless of whether the simulation involves breaking the conductor into segments (for example, Spectre simulation) or whether the simulation analytically treats the entire conductor, or interconnect, as a whole.

To the extent that the definitions provided above are consistent with ordinary, plain, and accustomed meanings (as generally shown by documents such as dictionaries and/or technical lexicons), the above definitions shall be considered controlling and supplemental in nature. To the extent that the definitions provided above are inconsistent with ordinary, plain, and accustomed meanings (as generally shown by documents such as dictionaries and/or technical lexicons), the above definitions shall control. If the definitions provided above are broader than the ordinary, plain, and accustomed meanings in some aspect, then the above definitions shall be considered to broaden the claim accordingly.

To the extent that a patentee may act as its own lexicographer under applicable law, it is hereby further directed that all words appearing in the claims section, except for the above-defined words, shall take on their ordinary, plain, and accustomed meanings (as generally shown by documents such as dictionaries and/or technical lexicons), and shall not be considered to be specially defined in this specification. Notwithstanding this limitation on the inference of "special definitions," the specification may be used to evidence the appropriate ordinary, plain and accustomed meanings (as generally shown by dictionaries and/or technical lexicons), in the situation where a word or term used in the claims has more than one alternative ordinary, plain and accustomed meaning and the specification is actually helpful in choosing between the alternatives.

Unless otherwise explicitly provided in the claim language, steps in method steps or process claims need only be performed in the same time order as the order the steps are recited in the claim only to the extent that impossibility or extreme feasibility problems dictate that the recited step order (or portion of the recited step order) be used. This broad interpretation with respect to step order is to be used regardless of whether the alternative time ordering(s) of the claimed steps is particularly mentioned or discussed in this document.

What is claimed is:

1. A computer system comprising:

a first computer portion structured and/or programmed to receive input characteristics of a transmission line to be simulated as a distributed resistance-capacitance (RC) interconnect, with the input characteristics being sufficient to define a transfer function for the simulated RC interconnect; and a second computer portion structured and/or programmed to determine at least one pole of the transfer function such that the transfer function is not truncated in the determination of the at least one pole;

wherein:

the transmission line has negligible inductance and is simulated as an RC interconnect;

the input characteristics comprise interconnect resistance (R), interconnect capacitance (C), driver resistance ($R_d$), load capacitance ($C_L$) and input signal waveform;

the transfer function is given by the following equation:

$H(s)=1/(1+A\theta^2)\cos h(\theta)+B\theta \sin h(\theta)$ where $A=R_TC_T$, $B=R_T+C_T$, $R_T=R_d/R$, $C_T=C_L/C$, $\theta=\sqrt{RCs}=jx_n$ where j is the imaginary unit and $x_n$ is the coefficient of the imaginary number $jx_n$ corresponding to the nth pole in the series of poles n=0,1,2, . . . , s=frequency variable of the transfer function, and $p_n$=the nth pole in the series of poles n=0,1,2, . . . ;

the second computer portion determines the at least one pole by transforming the denominator of the transfer function into terms of a variable x, finding at least one value for x such that the transformed denominator is equal to zero and using the at least one value for x to determine the at least one pole of the transfer function; and the at least one pole of the transfer function is solved in terms of variable x as:

$$p_n = \frac{-x_n^2}{RC}, n = 0, 1, 2, \ldots .$$

2. A computer system comprising:
a first computer portion structured and/or programmed to receive input characteristics of a transmission line to be simulated as a distributed resistance-capacitance-inductance (RLC) interconnect, with the input characteristics being sufficient to define a transfer function for the simulated RLC interconnect; and
a second computer portion structured and/or programmed to determine at least one pole of the transfer function such that the transfer function is not truncated in the determination of the at least one pole;
wherein:
the input characteristics comprise interconnect inductance (L), interconnect resistance (R), interconnect capacitance (C), driver resistance ($R_d$), load capacitance ($C_L$) and input signal waveform;
the second computer portion simulates the RLC interconnect by separating the driver and the interconnect and by representing the input signal waveform as a piecewise-linear waveform;
the transfer function of the separated interconnect is given by the following equation:
$H(s)=1/\cos h(\theta)+C_T\theta \sin h(\theta)$ where $C_T=C_L/C$, $\theta=\sqrt{RCs}=jx_n$ where j is the imaginary unit and $x_n$ is the coefficient of the imaginary number $jx_n$ corresponding to the nth pole in the series of poles n=0,1,2, ..., s=frequency variable of the transfer function, and $p_n$=the nth pole in the series of poles n=0,1,2, ...; and
the second computer portion determines the at least one pole by transforming the denominator of the transfer function into terms of a variable x, finding at least one value for x such that the transformed denominator is equal to zero and using the at least one value for x to determine the at least one pole of the transfer function.

3. The computer system of claim 2 wherein the second computer portion applies at least a portion of a Taylor series expansion to at least one trigonometric function in the transformed denominator in order to solve for the at least one value of x.

4. The computer system of claim 2 wherein the at least one pair of poles of the transfer function is solved in terms of variable x as:

$$p_{n,\pm} = \frac{-RC \pm \sqrt{R^2C^2 - 4LCx_n^2}}{2LC}, n = 0, 1, 2, \ldots .$$

5. A computer system comprising:
a first computer portion structured and/or programmed to receive input characteristics of a transmission line to be simulated as a distributed resistance-inductance-capacitance (RLC) distributed interconnect, with the input characteristics being sufficient to define a transfer function for the simulated RLC interconnect; and
a second computer portion structured and/or programmed to determine at least one pole of the transfer function such that the transfer function is not truncated in the determination of the at least one pole;
wherein:
the input characteristics comprise interconnect inductance (L), interconnect resistance (R), interconnect capacitance (C), driver resistance ($R_d$), load capacitance ($C_L$) and input signal waveform;
the second computer portion simulates the RLC interconnect by mapping the RLC interconnect with driver resistance into a system without driver resistance and determines corresponding values for interconnect resistance (R') and load capacitance ($C_L'$);
the transfer function of the mapped interconnect is given by the following equation:
$H(s)=1/\cos h(\theta)+C_T\theta \sin h(\theta)$ where $C_T=C_L'/C$, $\theta=\sqrt{R'Cs}=jx_n$ where j is the imaginary unit and $x_n$ is the coefficient of the imaginary number $jx_n$ corresponding to the nth pole in the series of poles n=0,1,2, ..., s=frequency variable of the transfer function, and $p_n$=the nth pole in the series of poles n=0,1,2, ...; and
the second computer portion determines the at least one pole by transforming the denominator of the transfer function into terms of a variable x, finding at least one value for x such that the transformed denominator is equal to zero and using the at least one value for x to determine the at least one pole of the transfer function.

6. The computer system of claim 5 wherein the second computer portion applies at least a portion of a Taylor series expansion to at least one trigonometric function in the transformed denominator in order to solve for the at least one value of x.

7. The computer system of claim 5 wherein the at least one pair of poles of the transfer function is solved in terms of variable x as:

$$p_{n,\pm} = \frac{-RC \pm \sqrt{R^2C^2 - 4LCx_n^2}}{2LC}, n = 0, 1, 2, \ldots .$$

8. A computer system comprising:
a first computer portion structured and/or programmed to receive input characteristics of a transmission line to be simulated as a distributed resistance-inductance-capacitance (RLC) interconnect, with the input characteristics being sufficient to define a transfer function for the simulated RLC interconnect; and
a second computer portion structured and/or programmed to determine at least one pole of the transfer function by transforming the denominator of the transfer function into terms of a variable x, finding at least one value for x such that the transformed denominator is equal to zero and using the at least one value for x to determine the at least one pole of the transfer function;
wherein:
the input characteristics comprise interconnect inductance (L), interconnect resistance (R), interconnect capacitance (C), driver resistance ($R_d$), load capacitance ($C_L$) and input signal waveform;
the second computer portion simulates the RLC interconnect by mapping the RLC interconnect with driver resistance into a system without driver resistance and determines corresponding values for interconnect resistance (R') and load capacitance ($C_L'$); and
the transfer function of the mapped interconnect is given by the following equation:
$H(s)=1/\cos h(\theta)+C_T\theta \sin h(\theta)$ where $C_T=C_L'/C$, $\theta=\sqrt{R'Cs}=jx_n$ where j is the imaginary unit and $x_n$ is the coefficient of the imaginary number $jx_n$ corresponding to the nth pole in the series of poles n=0,1,2, ..., s=frequency variable of the transfer function, and $p_n$=the nth pole in the series of poles n=0,1,2, ....

* * * * *